US012646759B2

(12) United States Patent
Yan et al.

(10) Patent No.: US 12,646,759 B2
(45) Date of Patent: Jun. 2, 2026

(54) METHOD AND APPARATUS FOR BATTERY OPERATION AND MAINTENANCE, AND ELECTRONIC DEVICE THEREWITH

(71) Applicant: Makesense Energy Technology Co., Limited., Shanghai (CN)

(72) Inventors: Xiao Yan, Shanghai (CN); Qiqi Yin, Shanghai (CN); Danfei Gu, Shanghai (CN)

(73) Assignee: Makesense Energy Technology Co., Limited., Shanghai (CN)

( * ) Notice: Subject to any disclaimer, the term of this patent is extended or adjusted under 35 U.S.C. 154(b) by 606 days.

(21) Appl. No.: 18/089,743

(22) Filed: Dec. 28, 2022

(65) Prior Publication Data

US 2023/0204681 A1    Jun. 29, 2023

(30) Foreign Application Priority Data

Dec. 28, 2021    (CN) .......................... 202111632210.9

(51) Int. Cl.
H01M 10/44        (2006.01)
G01R 31/382        (2019.01)
            (Continued)

(52) U.S. Cl.
CPC ........ H01M 10/441 (2013.01); G01R 31/382 (2019.01); G01R 31/389 (2019.01);
            (Continued)

(58) Field of Classification Search
CPC .......... H02J 7/0014; H02J 7/825; H02J 7/875; H02J 7/52; H01M 10/441; H01M 10/482;
            (Continued)

(56) References Cited

U.S. PATENT DOCUMENTS 5,705,929 A * 1/1998 Caravello ............ G01R 31/389
                                                    324/430
10,522,881 B1 * 12/2019 Hom ................... H01M 10/482
                        (Continued)

OTHER PUBLICATIONS

Zheng, Linfeng et al, "Incremental capacity analysis and differential voltage analysis based state of charge and capacity estimation for lithium-ion batteries," Energy, vol. 150, 2018, pp. 759-769 (Year: 2018).*

*Primary Examiner* — Andrew Schechter
*Assistant Examiner* — Ethan Wesley Edwards
(74) *Attorney, Agent, or Firm* — troutman pepper locke; Tim Tingkang Xia, Esq.

(57)            ABSTRACT

The invention discloses method and apparatus for operation and maintenance of a battery and an electronic device. The method includes: performing a charging/discharging process on a to-be-analyzed battery cluster, and determining key battery parameters (KBP) of a plurality of cells in the battery cluster; determining whether the battery cluster is abnormal depending on whether the KBPs of the cells in the battery cluster exceed a normal range; and performing operation and maintenance on the battery cluster in a case that the battery cluster is abnormal. The internal resistance, the capacity parameter, and the self-discharge parameter of the cells are used as the KBPs of the cells. Based on the KBPs, whether the cells are abnormal can be determined more accurately, and the cause of the abnormality can be determined. Accordingly, more accurate operation and maintenance can be subsequently realized for the battery cluster when required.

17 Claims, 14 Drawing Sheets

(51) Int. Cl.

| | |
|---|---|
| *G01R 31/389* | (2019.01) |
| *G01R 31/392* | (2019.01) |
| *G01R 31/396* | (2019.01) |
| *H01M 10/48* | (2006.01) |
| *H02J 7/00* | (2026.01) |
| *H02J 7/52* | (2026.01) |
| *H02J 7/82* | (2026.01) |

(52) U.S. Cl.
CPC ......... *G01R 31/392* (2019.01); *G01R 31/396* (2019.01); *H01M 10/482* (2013.01); *H02J 7/52* (2026.01); *H02J 7/825* (2026.01); *H02J 7/875* (2026.01)

(58) Field of Classification Search
CPC ................ G01R 31/389; G01R 31/392; G01R 31/396; G01R 31/382
See application file for complete search history.

(56) References Cited

U.S. PATENT DOCUMENTS

| | | | |
|---|---|---|---|
| 2016/0105042 A1* | 4/2016 | Taylor ................. | H01M 10/446 320/134 |
| 2018/0166911 A1* | 6/2018 | Ionescu ................... | B60L 58/16 |

\* cited by examiner

METHOD AND APPARATUS FOR BATTERY OPERATION AND MAINTENANCE, AND ELECTRONIC DEVICE THEREWITH

CROSS-REFERENCE TO RELATED PATENT APPLICATION

This application claims priority to and the benefit of Chinese Patent Application No. 202111632210.9, filed Dec. 28, 2021, which is incorporated herein in its entirety by reference.

FIELD OF THE INVENTION

The present invention relates to the field of battery, and in particular, to method and apparatus for battery operation and maintenance, an electronic device, and a computer-readable storage medium.

BACKGROUND OF THE INVENTION

With the development of electric vehicles, the price of lithium batteries dropped sharply. The cost performance of lithium batteries leads to an irreversible trend to replace lead-acid batteries to be used for low-speed electric vehicles and as standby power supplies. However, the two types of lithium battery energy storage applications have a common disadvantage, that is, lack an effective operation and maintenance system for ensuring the safety during the whole life cycle and the service life, which results in uncertain investment incomes of lithium batteries.

SUMMARY OF THE INVENTION

In order to resolve the above noted technical problems, embodiments of the present invention provide method and apparatus for battery operation and maintenance, an electronic device, and a computer-readable storage medium.

In a first aspect, an embodiment of the present invention provides a method for battery operation and maintenance, including:

performing a charging/discharging process on a to-be-analyzed battery cluster, and determining key battery parameters (KBP) of a plurality of cells in the battery cluster, where the KBPs include an internal resistance, a capacity parameter, and a self-discharge parameter;

determining whether the battery cluster is abnormal depending on whether the KBPs of the cells in the battery cluster exceed a normal range; and performing operation and maintenance on the battery cluster in a case that the battery cluster is abnormal.

In a second aspect, an embodiment of the present invention further provides an apparatus for battery operation and maintenance, including:

a charging/discharging module, configured to perform a charging/discharging process on a to-be-analyzed battery cluster, and determine KBPs of a plurality of cells in the battery cluster, where the KBPs include an internal resistance, a capacity parameter, and a self-discharge parameter;

an analysis module, configured to determine whether the battery cluster is abnormal depending on whether the KBPs of the cells in the battery cluster exceed a normal range; and an operation and maintenance apparatus module, configured to perform operation and maintenance on the battery cluster in a case that the battery cluster is abnormal.

In a third aspect, an embodiment of the present invention provides an electronic device, including a bus, a transceiver, a memory, a processor, and a computer program stored in the memory and runnable on the processor, where the transceiver, the memory, and the processor are connected through the bus, and when the computer program is executed by the processor, the steps in the method for battery operation and maintenance according to any of the above descriptions are implemented.

In a fourth aspect, an embodiment of the present invention further provides a computer readable storage medium storing a computer program, when the computer program is executed by a processor, steps in the method for battery operation and maintenance according to any of the above descriptions are implemented According to the battery operation and maintenance method and apparatus, the electronic device, and the computer-readable storage medium provided in embodiments of the present invention, the internal resistance, the capacity parameter, and the self-discharge parameter of the cells are used as the KBPs of the cells. Based on the KBPs, whether the cells are abnormal can be determined more accurately, and the cause of the abnormality can be determined. In the method, the battery cluster does not need to be disassembled, which avoids a waste of resources. In this way, more accurate operation and maintenance can be subsequently realized for the battery cluster when required. The operation and maintenance of the battery cluster can ensure the safety during the whole life cycle of an energy storage system where the battery cluster is located, improve the service life of the energy storage system, and ensure the investment incomes of the energy storage system.

BRIEF DESCRIPTION OF THE DRAWINGS

To describe the technical solutions in embodiments of the present invention or in the prior art more clearly, the following briefly describes the accompanying drawings required for describing the embodiments or the prior art. Apparently, the accompanying drawings in the following description show merely some embodiments of the present invention, and a person of ordinary skill in the art may derive other drawings from these accompanying drawings without creative efforts.

DETAILED DESCRIPTION OF THE INVENTION

The present invention is further illustrated below through embodiments, but the present invention is not limited to the scope of the embodiments.

Figure 1:
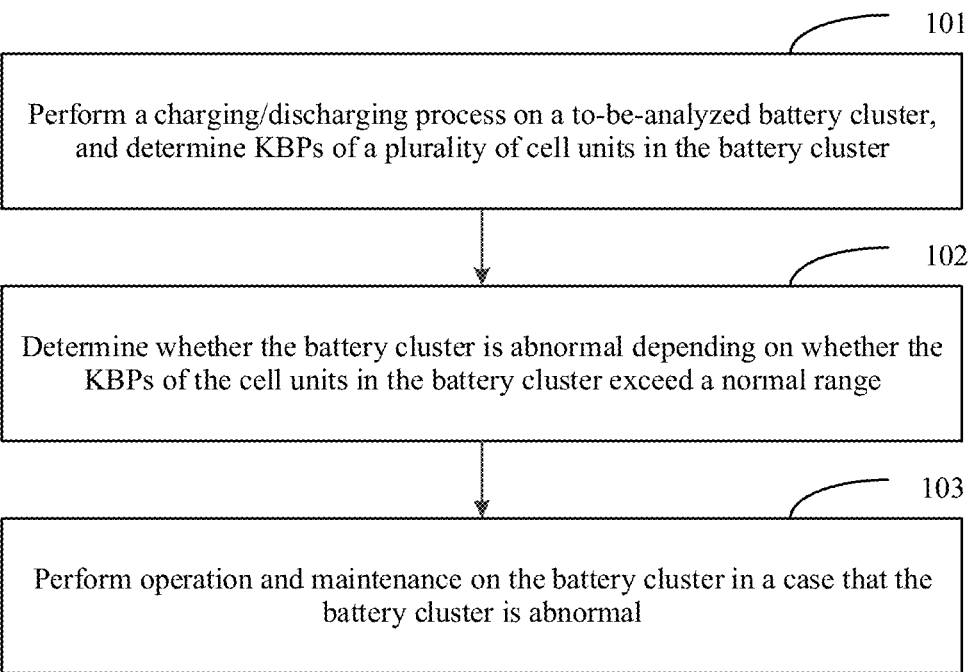
FIG. 1 a flowchart of a method for battery operation and maintenance according to an embodiment of the present invention.

FIG. 1 a flowchart of a method for battery operation and maintenance according to an embodiment of the present invention. As shown in FIG. 1, the method includes the following steps:

Step 101: Perform a charging/discharging process on a to-be-analyzed battery cluster, and determine key battery parameters (KBP) of a plurality of cells in the battery cluster, where the KBPs include an internal resistance, a capacity parameter, and a self-discharge parameter.

In one embodiment of the present invention, the battery cluster is a set of a plurality of cells. The battery cluster includes a plurality of cells, and the cells are connected in series. The cells in the battery cluster may be grouped into multiple battery modules, and each battery module includes multiple cells. In one embodiment, during analysis of the battery cluster, one or more consecutive cells in the battery cluster are considered as a cell unit for analysis. The performance of the whole battery cluster is determined by analyzing the performance of the cell unit. For example, a cell may be considered as a cell unit, or a battery module may be considered as a cell unit, which depends on an actual situation. Generally, one cell corresponds to one cell unit.

In this embodiment, when operation and maintenance need to be performed on the battery cluster needs, a charging/discharging process is performed on the battery cluster. The charging/discharging process includes a charging process and/or a discharging process, that is, the battery cluster may be charged or discharged, or the battery cluster may be first charged and then discharged or first discharged and then charged. Parameters to be used in the subsequent operation and maintenance process, that is, the KBPs are determined based on the charging/discharging process. Conventionally, the battery cluster is generally analyzed based on voltages of the cells in the battery cluster (this is because the voltages can be easily measured). However, an abnormal voltage of the cells has many causes. Therefore, it is difficult to accurately evaluate a state of the battery cluster based on the voltages. The KBPs used in one embodiment of the present invention include the internal resistance, the capacity parameter, and the self-discharge parameter of the cells. Based on the KBPs, whether the cells are abnormal can be determined more accurately, and the cause of the abnormality can be determined, facilitating more accurate subsequent operation and maintenance for the battery cluster.

The capacity parameters of the cells are parameters related to capacities of the cells, which may represent capacities of the cells in a certain state, such as current maximum capacities of the cells. The self-discharge parameter is a parameter representing a degree of self-discharge of the cell, such as a self-discharge rate.

Step 102: Determine whether the battery cluster is abnormal depending on whether the KBPs of the cells in the battery cluster exceed a normal range.

In one embodiment of the present invention, the normal range may be preset for the KBPs, and whether the battery cluster is abnormal or the cells in the battery cluster are abnormal may be determined based on the determined KBPs. Since the KBPs include the internal resistance, the capacity parameter, and the self-discharge parameter, it is necessary to set a normal range for each of the KBPs, and whether the battery cluster is abnormal or the cells in the battery cluster are abnormal may be determined based on whether the KBPs exceed the respective normal ranges.

Generally, whether the battery cluster is abnormal as a whole may be determined based on a difference between the KBPs of the plurality of cells. Alternatively, whether each of the cells is abnormal may be determined first. When there is an abnormal cell or a number of abnormal cells exceeds a preset number, the battery cluster is considered as abnormal.

Step 103: Operate and maintain the battery cluster in a case that the battery cluster is abnormal.

In one embodiment of the present invention, if the battery cluster is abnormal, operation and maintenance need to be performed on the battery cluster to restore the battery cluster to the normal state or reduce the risk of further deterioration of the battery cluster. In one embodiment of the present invention, the abnormality of the battery cluster may be finely analyzed to realize fine operation and maintenance.

In a case that the battery cluster is abnormal, the battery cluster may be in an abnormal state or a faulty state based on a degree of the abnormality. The abnormal state is a temporary state that is probably restored to the normal state, and the faulty state is a state that has potential safety hazards or that is likely to cause safety accidents. The abnormal state is a state with a low degree of abnormality, and the faulty state is a state with a high degree of abnormality. However, if factors causing the abnormal state are not eliminated in time, the abnormal state may develop into the unrecoverable faulty state. The abnormal state may alternatively be referred to as a sub-healthy state.

In one embodiment of the present invention, operation and maintenance rules may be preset, and corresponding operation and maintenance may be performed on the battery cluster based on the operation and maintenance rules. Operationally, the above step of "performing operation and maintenance on the battery cluster" may include the following steps:

Step A1: Dynamically adjust a charging/discharging control parameter of the battery cluster in a case that the battery cluster is in a sub-healthy state.

Step A2: Equalize the battery cluster if a capacity allowed to be increased that is determined based on the capacity parameters is greater than a preset capacity in a case that the battery cluster is in the sub-healthy state.

In one embodiment of the present invention, in a case that the battery cluster is in the sub-healthy state, a general warning rule may be executed. The general warning rule may include: dynamically adjusting the charging/discharging control parameter of the battery cluster in the sub-healthy state to use the battery cluster in a derated manner to avoid further deterioration of the health state of the battery cluster. In addition, after the battery cluster is restored to the normal state, for example, the abnormal cell in the battery cluster is replaced or maintained to restore the whole battery cluster to the normal state, the charging/discharging control parameter may be restored to the normal state.

The charging/discharging control parameter is a physical parameter used for controlling the charging/discharging process of the battery cluster, which may include a charging current, a discharging current, a charging ending voltage, a discharging ending voltage, and the like of the battery cluster. For example, when an internal resistance of a largest cell in the battery cluster $R_{max}=R_0 \times \alpha$. $R_0$ represents a reference resistance value of a cell, such as an initial value, and $\alpha > 1$. The rule for dynamically adjusting the charging/discharging control parameter for use in the derated manner may be as follows: 1) Adjustment of the charging/discharging current: power consumption of a smallest to-be-tested battery unit (such as a cell) is maintained unchanged, that is, $I^2R$ is a constant, where I is the current, and R is the internal resistance, and a current in the sub-healthy state is $I_{sub}=I_0/\alpha^{1/2}$, where $I_0$ is a charging or discharging current in a normal condition. 2) Adjustment of the charging/discharging ending voltage or an SOC threshold: a charging ending voltage control parameter $V_{max \ sub\text{-}healthy}=k_e V_{max \ normal}$, where a value of $k_e$ causes the SOC of the battery cluster to be in a range of 80%-95%, and a discharging ending voltage control parameter $V_{min \ sub\text{-}healthy}=k_d V_{min \ normal}$, where a value of $k_d$ causes the SOC of the battery cluster to be in a range of 5%-20%. $V_{max \ sub\text{-}healthy}$ indicates a charging ending voltage in the sub-healthy state, $V_{max \ normal}$ indicates a charging ending voltage in the normal state, $V_{min \ sub\text{-}healthy}$ indicates a discharging ending voltage in the sub-healthy state, and $V_{min \ normal}$ indicates the discharging ending voltage in the normal state.

Moreover, in a case that the battery cluster is in the sub-healthy state, if it is determined based on the capacity parameter of the cell that the battery cluster can be recovered through equalization, for example, the battery cluster may be increased by a capacity greater than a preset capacity value (such as 5%) through equalization, or the operation and maintenance person may be assigned to perform equalization when irreversible capacity fading can be avoided. Specific operation and maintenance manners are described later.

Optionally, when the battery cluster is in the sub-healthy state, an order may be placed through background supply chain management to ensure that a standby replacement battery module is available and may be used for replacement in time in response to an upgraded warning (for example, upgrading of a general warning to a serious warning).

Step A3: Enable/disable the battery cluster in a case that the battery cluster is in a faulty state.

In one embodiment of the present invention, in a case that the battery cluster is in the faulty state, a serious warning rule may be executed. The serious warning rule may include enabling/disabling the battery cluster. The enabling/disabling may specifically include: an auto battery management system (ABMS) transmits instructions to a master control of the battery cluster where the faulty cell is located to automatically disconnect the battery cluster from the entire energy storage system by disconnecting a circuit breaker, so as to enter am "enabling/disabling" management mode, notifies the operation and maintenance person to perform operation and maintenance as soon as possible, and for the battery cluster under the enabling/disabling management, immediately assigns the operation and maintenance person to go to the site to replace the faulty battery module with the standby battery module and to determine that the battery cluster is restored to the normal state through quick diagnosis after the replacement.

Optionally, the operation and maintenance processing process may further include correcting the SOC of the battery cluster, regular inspection, and the like. For example, when it is found that an SOC error exceeds a specific numerical value (such as 5%), correction is performed to recalibrate the SOC. Alternatively, the method of extracting the KBPs without disassembly is tested regularly according to preset work steps to ensure that the method of extracting the KBPs is effective.

According to the method for battery operation and maintenance provided in one embodiment of the present invention, the internal resistance, the capacity parameter, and the self-discharge parameter of the cells are used as the KBPs of the cells. Based on the KBPs, whether the cells are abnormal can be determined more accurately, and the cause of the abnormality can be determined. In this way, more accurate operation and maintenance can be subsequently realized for the battery cluster when required. The operation and maintenance of the battery cluster can ensure the safety during the whole life cycle of an energy storage system where the battery cluster is located, improve the service life of the energy storage system, and ensure the investment incomes of the energy storage system.

Based on any of the above embodiments, a corresponding threshold may be set for each KBP, and a normal range may be determined based on the threshold. Alternatively, a distribution of the KBPs of the plurality of cells may be used as a determination basis, that is, a normal distribution range may be preset, and the normal distribution range may be used as the normal range for determining whether the cells are abnormal. Alternatively, it may be comprehensively determined whether the cells are abnormal based on the above threshold and the normal distribution range.

Step 102 of "determining whether the battery cluster is normal" may include the following steps:

Step B1: Preset a corresponding abnormality threshold for the KBPs.

Step B2: Determine that the cells in the battery cluster are abnormal in a case that the KBPs of the cells exceed the abnormality threshold.

As the battery cluster is charged/discharged many times, various performance parameters of the battery cluster change, and the KBPs change accordingly. Based on the changes of the KBPs, the corresponding abnormality threshold may be preset in one embodiment of the present invention. If the KBPs of the cells exceed the abnormality threshold, it indicates that the cells may be abnormal.

The KBPs may include the internal resistance, the capacity parameter, the self-discharge parameter, and the like, and the capacity parameter and the self-discharge parameter may include various parameters. In this embodiment, a corresponding abnormality threshold may be set for each type of KBPs. The abnormality threshold is a threshold determined according to a KBP in historical operation data or a safety parameter provided by a manufacturer. For example, changes of a KBP of some other cell (or a cell with a different degree of health) during use may be collected, to determine an abnormality threshold for the KBP when the cell is faulty.

In one embodiment of the present invention, the state of the abnormal cell is classified into an abnormal state or a faulty state. Therefore, a plurality of abnormality thresholds may be set for each type of KBP to determine the abnormal state or the faulty state. The abnormality threshold may include a reliability threshold and a safety threshold. The reliability threshold is used for distinguishing between a normal state and an abnormal state, and the safety threshold is used for distinguishing between an abnormal state and a faulty state. In some cases, the manufacturer may provide various safety parameters, based on which the reliability threshold and the safety threshold may be determined.

For example, if the manufacturer determines that a reliability threshold and a safety threshold for an internal resistance are respectively 1.3 and 3 times of an initial internal resistance of a cell, when an internal resistance of the cell exceeds 1.3 times and 3 times of the initial value, it may be determined that the cell is in the abnormal state and the faulty state, and a reliability alarm and a safety alarm may be sent.

If the manufacturer determines that a reliability threshold and a safety threshold for a self-discharge rate are respectively 2%/month and 5%/month, a voltage difference threshold between different times near full charge is calculated according to an OCV-SOC curve, and a reliability alarm or a safety alarm may be sent depending on whether an open circuit voltage (OCV) difference obtained through form detection and equivalent detection exceeds the voltage difference threshold.

For a maximum capacity, a lithium battery manufacturer generally provides quality guarantee for a capacity fading to 80%, which may be considered as a reliability threshold, and if the manufacturer uses a capacity fading to 50% of an initial value as a safety threshold, a reliability alarm or a safety alarm is sent depending on whether an actual detected value is lower than 50% or 80% of the initial value.

Establishing an effective fault warning model is complex. This is because: 1) the KBPs (such as the internal resistance and the capacity parameter) reflecting the performance cannot be detected directly, but are calculated through the voltage and current changes; and 2) it is usually difficult to learn how the KBPs change from the normal state to faulty state gradually through the abnormal state. In one embodiment of the present invention, the abnormality threshold $r_{th}$ is determined based on a constant false alarm principle, so as to determine whether the cell is in faulty (whether the cell is in the faulty state) while a false alarm rate is ensured, thereby effectively avoiding misjudgment. The abnormality threshold $r_{th}$ is: $r_{th}=(r_1+r_0)/2+\sigma^2 \ln \lambda/(r_1-r_0)$, where $r_1$ is a value corresponding to a determination that the KBP is abnormal, $r_0$ and $\sigma$ respectively represent an average value and a mean square difference of a data stream transmitted when the KBPs are normal, and $\lambda$ is a preset coefficient related to a confidence level.

Specifically, the KBPs such as the internal resistance and the self-discharge rate of the lithium battery will gradually increase during the whole life cycle, especially during aging. When the KBPs exceed a threshold, a probability of an abnormality or a fault will greatly increase, which corresponds to a great increase in problems regarding reliability and safety. In one embodiment of the present invention, a value $r_1$ of a KBP r in the faulty state and an average value $r_0$ and a mean square difference $\sigma$ of a data stream thereof in the non-faulty state (the normal state and/or the abnormal state) are predetermined. Through normalization, a coefficient of variation is $t=\sigma/r_0$, a normalized value of $r_1$ is $x_1=(r_1-r_0)/r_0$, and a normalized KBP r is $x=(r-r_0)/r_0$.

In a lithium battery fault determination system, $H_0$ and $H_1$ represent different candidate fault warning signals of a receiver. When the candidate fault warning signal is assumed as $H_1$, a fault determination output voltage is 1.

When the candidate fault warning signal is assumed as $H_0$, the fault determination output voltage is 0. An input signal is obtained by superimposing noise n(t) on the fault warning signal, and the additional noise n(t) may be Gaussian noise with a mean value of zero and a variance of 1. A fault diagnosis and detection mechanism with a false alarm probability $P_F=a$ (for example, a=0.1, which corresponds to 90% confidence) is constructed in a way similar to a way in which a radar receiver captures signals. There are four situations for the input of abnormal signals to the receiver and the decision of a detector:

1. If $H_0$ is true, $D_0$ is determined, that is, no fault signal is inputted, and the detector determines that there is no fault signal, which is referred to as correct non-discovery.
2. If $H_0$ is true, $D_1$ is determined, that is, no fault signal is inputted, and the detector determines that there is a fault signal, which is referred to as false alarm.
3. If $H_1$ is true, $D_0$ is determined, that is, a fault signal is inputted, and the detector determines that there is no fault signal, which is referred to as missing alarm.
4. If $H_1$ is true, $D_1$ is determined, that is, a fault signal is inputted, and the detector determines that there is a fault signal, which is referred to as correct detection.

Case 1 and case 4 are correct determination, and the other two cases are wrong determination.

Under the assumptions of $H_1$ and $H_0$, if r is the KBP (such as the internal resistance) of the lithium battery obtained from the data stream, $r_0$ is a mean value in the normal condition, and $r_1$ is a value in the faulty condition (such as a mean value). Assuming that the variances $\sigma$ of the KBP in the normal condition and in the faulty condition are the same, if a Gaussian variable n with a mean value of 0 and a variance of 1 is introduced, $n\times\sigma$ is a mean square difference of a characteristic value of the battery. Therefore, the output signal of the receiver may be written as:

$$H_1: r=r_1+n\times\sigma;$$

$$H_0: r=r_0+n\times\sigma.$$

Probability density functions of r under the two assumptions are respectively:

$$p(r|H_1)=(\tfrac{1}{2}\pi)\exp(-(r-r_1)^2/2\sigma^2);$$

$$p(r|H_0)=(\tfrac{1}{2}\pi)\exp[-(r-r_0)^2/2\sigma^2].$$

A likelihood ratio is:

$$\lambda(r)=p(r|H_1)/p(r|H_0)=\exp(-(r-r_1)^2/2\sigma^2)/\exp[-(r-r_0)^2/2\sigma^2].$$

Therefore, a determination rule is: if $\lambda(r)$ is greater than a preset threshold $\lambda$, it is determined that a fault signal is inputted, and if $\lambda(r)$ is less than $\lambda$, it is determined that there is no fault signal. The above formula is written in a form of a log likelihood ratio as:

$$\ln \lambda(r)=\ln[p(r|H_1)/p(r|H_0)]=[(r-r_0)/\sigma^2]\times[r-(r_1+r_0)/2].$$

$$\text{Let } r_0'=(r_1+r_0)/2,$$

$$(r_1-r_0)\times(r-r_0')=\sigma^2 \ln \lambda.$$

$r_0'$ is substituted into the formula, and then two ends of the formula are divided by $r_0^2$, and let $\alpha/r_0$, $x_1=(r_1-r_0)/r_0$, and $x=(r-r_0)/r_0$. After normalization, the above formula becomes:

$$x_1\times[x-x_1/2]=t^2 \ln \lambda.$$

$$\text{That is, } x=x_1/2+t^2 \ln \lambda/x_1.$$

where $\lambda$ is a parameter determined based on the constant false alarm, $\lambda = p(z_0|H_1)/p(z_0|H_0)$, and $z_0$ is a fault signal comparison threshold. A value of $\lambda$ is related to the confidence level. For example, a confidence level of 90% corresponds to $\lambda = 2.2$ or $\ln \lambda = 0.79$.

Accordingly, a fault threshold $x_{th}$ indicating whether there is a fault is: $x_{th} = x_1/2 + (t^2/x_1)\ln \lambda$.

At this time, a warning determination rule for determining whether the battery cluster is faulty is: if the fault signal $x \geq x_{th}$, it is determined that there is a fault. If $x < x_{th}$, it is determined that there is no fault.

For the KBP r, the abnormality threshold $r_{th}$ thereof corresponding to the above fault threshold $x_{th}$ is $r_{th} = (r_1 + r_0)/2 + \sigma^2 \ln/(r_1 - r_0)$. In a case that $\lambda = 2.2$, if the KBP r of a cell exceeds the corresponding abnormality threshold $r_{th}$, it indicates that there is a 90% probability that the cell is faulty.

Alternatively, when determining whether the battery cluster is abnormal based on the normal distribution range, step 102 of "determining whether the battery cluster is normal" may include the following steps:

Step B3: Determine whether the KBPs of the plurality of cells exceed a normal distribution range according to a distribution of the KBPs of the cells.

Step B4: Determine that the cells are abnormal in a case that the KBPs of the cells exceed the normal distribution range.

In one embodiment of the present invention, in the normal condition, the distribution of the KBPs should be a Gaussian distribution, and the distribution of the KBPs of the plurality of cells may represent the consistency of the KBPs. The normal distribution range may be preset for each type of KBP. Since the each type of KBP should conform to the Gaussian distribution, the each type of KBP may alternatively be normalized, and the same normal distribution range may be set for the normalized KBPs. The way to set the normal distribution range is not limited in this embodiment. For example, the KBP should conform to the Gaussian distribution, and there is a probability of 95% that the KBP of the cell is within a range of $2\sigma$, where $\sigma$ is a root mean square of $\Delta t$. That is to say, if the KBP of a cell in the battery cluster is not within the range of $2\sigma$, there is a probability of 95% that the cell is abnormal. Alternatively, there is a probability of 99.7% that the KBP of the cell is within a range of $3\sigma$. If the KBP of a cell in the battery cluster is not within the range of $3\sigma$, there is a probability of 99.7% that the cell is abnormal. The normal distribution range for determining abnormality is related to the confidence level. When $2\sigma$ is used as a threshold of the normal distribution range, the confidence level is 95%, and when $3\sigma$ is used as the threshold of the normal distribution range, the confidence level is 99.7%.

In one embodiment of the present invention, based on the preset normal distribution range, internal resistance consistency diagnosis, self-discharge rate consistency diagnosis, capacity consistency diagnosis, and the like can be realized. For example, in a normal situation, the self-discharge rate should be in a Gaussian distribution, and there is a probability of 95% that the self-discharge rate of the cell is within a range of $2\sigma$, where $\sigma$ is a root mean square of the self-discharge rate. If the self-discharge rate of a cell in the battery cluster is not within the range of $2\sigma$, there is a probability of 95% that the cell is abnormal.

In addition, although it may be determined based on the normal distribution range whether the cell is abnormal, it is difficult to accurately determine whether the cell is in the abnormal state or the faulty state. Therefore, in this embodiment, comprehensive determination may be performed based on the normal distribution range and the abnormality threshold. For example, in a case that the KBP of the cell exceeds the normal distribution range, it is determined that the cell is abnormal. In addition, if the KBP of the cell exceeds the abnormality threshold (such as the abnormality threshold $r_{th}$), it is determined that the cell is in the faulty state. If the KBP of the cell does not exceed the abnormality threshold, it is determined that the cell is in the abnormal state.

Based on any of the above embodiments, in one embodiment of the present invention, the KBP of the each cell may be determined based on the charging/discharging data in the charging/discharging process. The charging/discharging data includes the charging/discharging voltage, the charging/discharging current, and the like of the cell. For example, the charging voltages at a plurality of times may form a voltage time sequence. The respective KBP of the each cell may be determined based on the charging/discharging data.

In one embodiment of the present invention, a $k^{th}$ to-be-analyzed cell in the battery cluster is referred to as a "cell k", where $k = 1, 2, \ldots, n$, and n represents a number of cells. For the cell k, a reference voltage $V_{ksta}$ of the cell k may be determined based on charging/discharging data of the cell k, and an $OCV_k$ of the cell k may be determined, so as to determine an internal resistance $R_k$ of the cell k. $R_i = (V_{ksta} - OCV_k)/I$, where I represents a current value in the charging/discharging process. In the charging/discharging process, a constant current exists from a beginning time of the charging/discharging process to a time when the cell k reaches the reference voltage $V_{ksta}$, that is, the current value I is a fixed value.

For example, the reference voltage $V_{ksta}$ may be a voltage across the $k^{th}$ cell after a period of time (such as 0.1-20 s, for example, 10 s) since beginning of constant current charging. Alternatively, in the constant current charging process, a capacity of the $k^{th}$ cell may be determined as $Q_k = \int I dt$, and a differential change of the capacity $Q_k$ with the voltage may be obtained from the voltage time sequence of the $k^{th}$ cell. In this embodiment, the differential change is referred to as a differential capacity versus voltage. For a lithium iron phosphate battery, the differential capacity versus voltage of $k^{th}$ cell is $dQ_k/dV$. For a ternary battery, the differential capacity versus voltage of the $k^{th}$ cell is $d^2Q_k/dV^2$. In this embodiment, a voltage $V_{kmax}$ when the differential capacity versus voltage reaches a maximum value may also be used as the reference voltage $V_{ksta}$ of the $k^{th}$ cell.

In one embodiment of the present invention, the capacity parameter of the cell may include the maximum capacity and/or other parameters that may represent the capacity of the cell. In this embodiment, a full charging/discharging process is performed on the to-be-analyzed battery cluster. The full charging/discharging process includes a full charging process and/or a full discharging process, that is, the battery cluster may be fully charged and fully discharged.

Full charging means charging the battery cluster to a fully charged state from a fully discharged state, and full discharging means discharging the battery cluster to the fully discharged state from the fully charged state. In addition, a constant current exists in at least part of the full charging/discharging process, that is, constant current charging or constant current discharging is performed for at least part of the full charging/discharging process. For example, the constant current exists in the whole full charging/discharging process. For example, the full charging process begins when the battery cluster reaches a discharging ending voltage and ends when the battery cluster reaches a charging ending voltage, and the full discharging process begins when the battery cluster reaches the charging ending voltage and ends when the battery cluster reaches the discharging ending voltage. More capacity parameters may be calculated based on the full charging process or the full discharging process.

Figure 2:
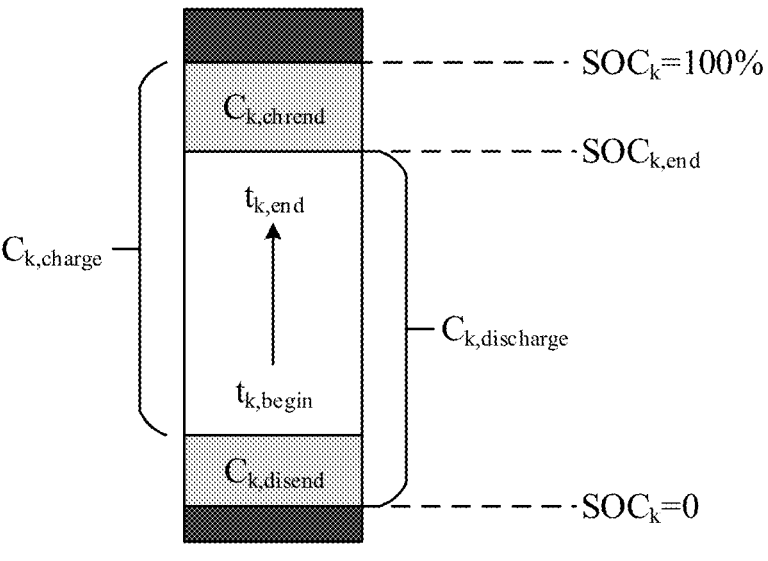
FIG. 2 is a schematic capacity distribution diagram of a cell according to an embodiment of the present invention.

Generally, after a plurality of charging/discharging cycles, the cells in the battery cluster have inconsistent capacities. A capacity distribution of one cell may be shown in FIG. 2. FIG. 2 shows a capacity distribution of the cell k. Since irreversible charging/discharging areas exist in the cell, in order to avoid irreversible reduction of a cell life caused by charging or discharging in the irreversible charging/discharging areas, an ending voltage (including a charging ending voltage and a discharging ending voltage) is usually used for the battery cluster for charging/discharging management. Dark areas at upper and lower ends in FIG. 2 represent the irreversible charging/discharging areas. Other areas are all reversible charging/discharging areas. The reversible charging/discharging area of the cell k corresponds to areas in FIG. 2 having an $SOC_k$ from 0 to 100%.

When the battery cluster is fully charged, that is, when battery cluster reaches the charging ending voltage, the cell therein is also fully charged, that is, the SOC reaches 100%. For example, the SOC of the cell k is $SOC_k=100\%$. However, due to a charging protection mechanism of the battery cluster, only a few cells are fully charged or even one cell is fully charged at this time, and the capacities of the other cells are not full. Likewise, when the battery cluster is fully discharged, that is, when the battery cluster reaches the discharging ending voltage, the cell therein is also fully discharged, that is, the SOC is 0. For example, the SOC of the cell k is $SOC_k=0$. However, due to a discharging protection mechanism of the battery cluster, only a few cells are fully discharged or even one cell is fully discharged at this time, and the capacities of the other cells are not zero. In practice, "fully charged" and "fully discharged" are expressed with respect to the battery cluster. Due to the inconsistency of the cells, it cannot be ensured that all of the cells are fully charged or fully discharged.

If a beginning time of the full charging/discharging process of the battery cluster is $t_{k,begin}$, and an ending time is $t_{k,end}$, a beginning time of the full charging/discharging process of each of the cells in the battery cluster is $t_{k,begin}$, and an ending time is $t_{k,end}$. In FIG. 2, the full charging process of the battery cluster is exemplified, that is, the battery cluster is charged to the charging ending voltage from the discharging ending voltage. As shown in FIG. 2, $t_{k,begin}$ represents a beginning time of the full charging process, and $t_{k,end}$ represents an ending time of the full charging process. As shown in FIG. 2, when the battery cluster is fully charged and reaches the charging ending voltage, that is, at $t_{k,end}$, a battery level of the cell k is expressed as $C_{k,discharge}$. A value of the battery level $C_{k,discharge}$ may represent a capacity by which the cell k may be discharged after the battery cluster is fully charged, which is referred to as a "discharge capacity" in this embodiment. Due to the inconsistency of the cells, the SOC of the cell k at a charging ending moment (that is, $t_{k,end}$) of the battery cluster is not necessarily 100%. In this embodiment, the SOC of the cell k at the charging ending moment of the battery cluster is referred to as a "charging ending SOC", which is represented by $SOC_{k,end}$. In addition, at the charging ending moment of the battery cluster, the cell k may not be fully charged and may be further charged by a battery level, that is, the cell k has "a capacity for further charging at the charging ending moment". In this embodiment, $C_{k,chrend}$ represents the capacity by which the cell k may be further charged when the charging ending moment of the battery cluster is reached.

Similarly, when the battery cluster is fully discharged and reaches the discharging ending voltage, that is, at $t_{k,begin}$, the cell k is not fully discharged and has a remaining battery level, that is, $C_{k,disend}$. The battery level may represent a capacity by which the cell k may be further discharged when the discharging ending moment of the battery cluster is reached. Moreover, if the inconsistency between the cells is not considered from the beginning time $t_{k,begin}$ of the full charging process of the battery cluster, the cell k is supposed to be fully charged, and the SOC thereof can reach 100%. In this embodiment, a capacity of the cell k from the discharging ending voltage of the battery cluster to full charge is represented by a battery level by which the cell k may be charged, and is referred to as a "charge capacity", which is represented by $C_{k,charge}$.

FIG. 2 illustrates some capacity parameters of a cell. For example, the cell k may include the following capacity parameters: the capacity $C_{k,chrend}$ by which the cell k is to be further charged when the charging ending moment of the battery cluster is reached, the capacity $C_{k,disend}$ by which the cell k is to be further discharged when the discharging ending moment of the battery cluster is reached, the charge capacity $C_{k,charge}$ of the cell k, and the discharge capacity $C_{k,discharge}$ of the cell k. Moreover, as shown in FIG. 2, the maximum capacity $Q_{kmax}$ of the cell k is a sum of the charge capacity $C_{k,charge}$ of the cell k and the capacity $C_{k,disend}$ for further discharging at the discharging ending moment or a sum of the discharge capacity $C_{k,discharge}$ of the cell k and the capacity $C_{k,chrend}$ for further discharging at the charging ending moment. That is to say, $Q_{kmax}=C_{k,charge}+C_{k,disend}=C_{k,discharge}+C_{k,chrend}$.

Optionally, in one embodiment of the present invention, the capacity parameter of the battery cluster is accurately determined by using the times and the SOCs in the charging/discharging process. Step 101 of "performing the charging/discharging process on the to-be-analyzed battery cluster, and determining the KBPs of the plurality of cells in the battery cluster" may include the following steps:

Step C1: Perform a full charging/discharging process on a to-be-analyzed battery cluster, and determine differential capacities versus voltage of a plurality of cells in the battery cluster at different times, where a constant current exists in at least part of a time period of the full charging/discharging process.

In one embodiment of the present invention, in a case that the full charging/discharging process is performed on the battery cluster, charging/discharging data such as a voltage and a current of each cell in the battery cluster may be acquired in real time through an existing detection device, so that differential capacities versus voltage of the plurality of cells in the battery cluster at different times can be determined. That is to say, a relationship between the differential capacity versus voltage of the cell and the time can be determined. For a lithium iron phosphate battery, a differential capacity versus voltage of an $i^{th}$ cell is $dQ_i/dV$ For a ternary battery, a differential capacity versus voltage of an $i^{th}$ cell is $d^2Q_i/dV^2$.

Step C2: Determine first times and first SOCs when the differential capacities versus voltage of the cells reach a first peak and second times and second SOCs when the differential capacities versus voltage of the cells reach a second peak, and determine capacity parameters of the cells according to the first times, the first SOCs, the second times, and the second SOCs, where the second SOCs are greater than the first SOCs.

Figure 3:
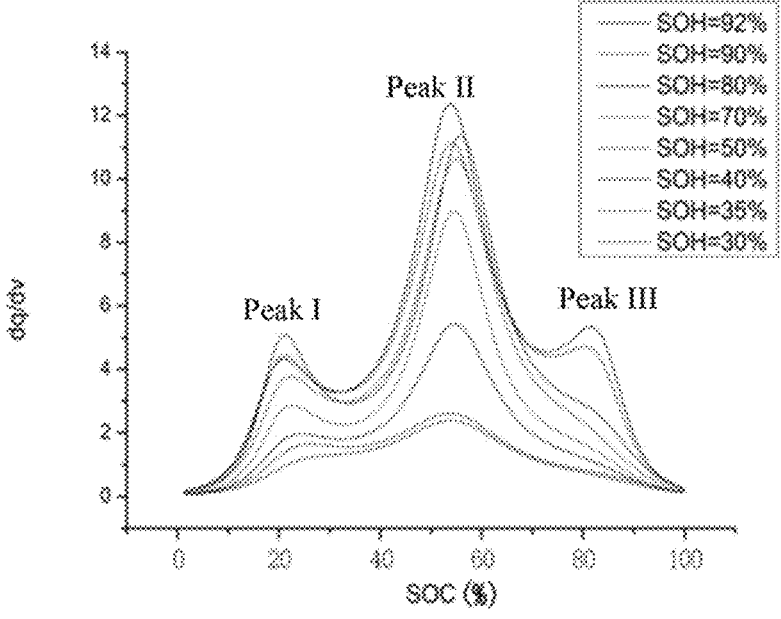
FIG. 3 shows a relationship between a differential capacity versus voltage and a state of charge (SOC) at different states of health (SOH).

In one embodiment of the present invention, a capacity parameter of a corresponding cell may be determined based on the fact that differential capacities versus voltage of cells with different states of health (SOH) reach peaks consistently. Specifically, for relationships between differential capacities versus voltage and SOCs of the cells in the same battery cluster in different SOHs, reference may be made to FIG. 3. In FIG. 3, the differential capacity versus voltage is represented by dq/dv. It can be learned from FIG. 3 that as the SOH of the cells decreases gradually, SOC values corresponding to a peak I and a peak II almost remain unchanged. Therefore, the SOC may be considered as a fixed value. Therefore, the SOC values corresponding to the differential capacities versus voltage at the peak I and the peak II may be pre-determined.

For the to-be-analyzed battery cluster, the first times and the first SOCs when the differential capacities versus voltage of the cells therein reach the first peak and the second times and the second SOCs when the differential capacities versus voltage of the cells reach the second peak may be determined. The first peak and the second peak are peaks where the differential capacity versus voltage has a fixed SOC at different SOHs. The first peak may be a first one of peaks the differential capacity versus voltage reaches as the SOC increases, such as a peak I in FIG. 3. The second peak may be a peak where the differential capacity versus voltage reaches a maximum value, such as a peak II in FIG. 3.

In the full charging/discharging process, if I represents a current, a battery level of the cell is $Q=\int I dt$. Since full charging/discharging process is a constant current charging/discharging process, the SOC changes linearly with time. Therefore, a relationship between the differential capacity versus voltage and the SOC and a relationship between the differential capacity versus voltage and time are similar. Thus, when the differential capacity versus voltage reaches a corresponding peak with time, the SOC reaches the corresponding peak. A time when the differential capacity versus voltage reaches the first peak, that is, the first time, may be determined by using the differential capacities versus voltage of the cell at different times, and the SOC of the cell at this time, that is, the first SOC may be determined. Likewise, a time when the differential capacity versus voltage reaches the second peak, that is, the second time, may be determined, and the SOC of the cell at this time, that is, the second SOC may be determined. Since the first SOC and the second SOC are fixed values, the first SOC and the second SOC may be pre-determined. In order to help distinguish between the first peak and the second peak, in this embodiment, a peak with a larger SOC is referred to as the second peak, that is, the second SOC is greater than the first SOC.

After the parameters such as the first time, the first SOC, the second time, and the second SOC are determined, the capacity parameter of the cell may be determined based on the parameters. For example, if the first SOC of the cell k when reaching the first peak is $SOC_{k,I\ peak}$, and the second SOC of the cell when reaching the second peak is $SOC_{k,II\ peak}$, a difference $\Delta SOC_k$ between the SOCs of the cell k when reaching the first peak and the second peak may be determined, where $\Delta SOC_k = SOC_{k,II\ peak} - SOC_{k,I\ peak}$. Since the first SOC and the second SOC are usually fixed values, the difference between the first SOC and the second SOC may be pre-determined, that is, $\Delta SOC_k$ is pre-determined, and different k values correspond to the same SOC difference $\Delta SOC_k$.

Moreover, a difference $\Delta Q_k$ between capacities of the cell k when reaching the first peak and the second peak may be determined, and then a maximum capacity $Q_{kmax}$ of the cell k may be determined, where $Q_{kmax}=100\%\times\Delta Q_k/\Delta SOC_k$. The capacity difference is $\Delta Q_k=Q_{k2}-Q_{k1}$. $Q_{k2}$ represents the capacity of the cell k when reaching the second peak, such as a capacity of the cell when reaching the peak II, and $Q_{k1}$ represents a capacity of the cell k when reaching the first peak, such as a capacity of the cell when reaching the peak I. Specifically, the capacity difference $\Delta Q_k$ may be determined based on the first time $t_{k,I\ peak}$ and the second time $t_{k,II\ peak}$ of the cell k and the current value I in the full charging/discharging process. For example, determining the difference $\Delta Q_k$ between the capacities of the cell k when reaching the first peak and the second peak includes: determining the capacity difference $\Delta Q_k$ between the first peak and the second peak according to the first time $t_{k,I\ peak}$ when the cell k reaches the first peak and the second time $t_{k,II\ peak}$ when the cell reaches the second peak, where $$\Delta Q_k = \int_{t_{k,I\ peak}}^{t_{k,II\ peak}} I\ dt,$$

and I represents the current value in the full charging/discharging process.

It should be noted that in order to accurately locate the first peak and the second peak, a constant current needs to exist from a relatively small SOC to the second peak (that is, the second SOC). For example, if the full charging/discharging process includes a full charging process, the constant current may exist in a time period from a charging beginning time to a time when all of the cells reach the second peak (for example, a largest one of the second times). If the full charging/discharging process includes a full discharging process, the constant current may exist in a time period from the earliest time of the plurality of cells when the second peak is reached (for example, a smallest one of the second values) to a discharging ending time.

In one embodiment of the present invention, based on the fact that the SOCs when the differential capacities versus voltage reach peaks are relatively fixed, the capacity parameters of the cells in the battery cluster can be accurately determined by using the times and the SOCs in the charging/discharging process, which realizes quantitation of the capacity of the each cell. In the method, the capacity parameter of the each cell can be determined without a need to disassemble the battery cluster, which avoids a waste of resources. In addition, the capacity parameters can be quickly and accurately determined through a full charging/discharging process. The method requires only a small calculation amount, can be easily implemented, and can realize relatively accurate quantitative analysis for the battery cluster. Moreover, various capacity parameters can be determined by using the full charging/discharging process, which facilitates quantitative analysis of the operation and maintenance effects during subsequent operation and maintenance of the battery cluster such as equalization.

In one embodiment of the present invention, the charging ending $SOC_{k,end}$ of the cell k may be determined based on the time and the SOC of the cell k in full charging/discharging process, and then various capacity parameters of the cell k may be determined. Specifically, step C2 of

|

"determining the capacity parameters of the cells according to the first times, the first SOCs, the second times, and the second SOCs" may further include the following step:

Step C21: Determine a charging ending $SOC_{k,end}$ of the cell k at the charging ending moment of the battery cluster according to a target time and a target SOC when the cell k reaches a target peak and the maximum capacity $Q_{kmax}$ of the cell k, where the target peak is the first peak or the second peak, and the target time is the corresponding first time or second time.

When the battery cluster reaches the charging ending voltage or the discharging ending voltage, due to the inconsistent states of the different cells in the battery cluster, the state of the each cell cannot be directly determined. In one embodiment of the present invention, based on the fact that the SOC at the first peak or the second peak can be obtained, the first peak or the second peak is used as the target peak, and an SOC between the target peak and the charging ending moment of the battery cluster may be determined based on the charging/discharging data in the full charging/discharging process and the maximum capacity $Q_{kmax}$, and the charging ending $SOC_{k,end}$ of the cell k may be determined.

Optionally, when the full charging/discharging process includes the full charging process, the charging ending moment of the battery cluster corresponds to a charging ending time $t_{k,chrend}$ of the full charging process. If a current value of the full charging process is I, a battery level from the target time $t_{k,T\ peak}$ of the target peak to the charging ending moment of the battery cluster is $$\int_{t_{k,T\ peak}}^{t_{k,chend}} I\ dt.$$

An SOC corresponding to the battery level is $$\int_{t_{k,T\ peak}}^{t_{k,chend}} I\ dt/Q_{kmax}.$$

Therefore, the charging ending $SOC_{k,end}$ of the cell k satisfies:

$$SOC_{k,end} = SOC_{k,T\ peak} + \int_{t_{k,T\ peak}}^{t_{k,chend}} I\ dt/Q_{kmax}.$$

For example, the target peak is the second peak, that is, the target SOC is $SOC_{k,II\ peak}$, and the target time is $t_{k,II\ peak}$. In this case, the charging ending $SOC_{k,end}$ of the cell k satisfies:

$$SOC_{k,end} = SOC_{k,II\ peak} + \int_{t_{k,II\ peak}}^{t_{k,chend}} I\ dt/Q_{kmax}.$$

Similarly, when the full charging/discharging process includes the full discharging process, the discharging ending moment of the battery cluster corresponds to a discharging beginning time $t_{k,disbegin}$ of the full discharging process. If a current value of the full discharging process is I, a battery level between the target time $t_{k,T\ peak}$ of the tar et peak and the discharging beginning moment of the battery cluster is $$\int_{t_{k,disbegin}}^{t_{k,Tpeak}} I\ dt.$$

An SOC corresponding to the battery level is $$\int_{t_{k,disbegin}}^{t_{k,Tpeak}} I\ dt.$$

Therefore, the charging ending $SOC_{k,end}$ of the cell k satisfies:

$$SOC_{k,end} = SOC_{k,T\ peak} + \int_{t_{k,disbegin}}^{t_{k,Tpeak}} I\ dt/Q_{kmax}.$$

$SOC_{k,T\ peak}$ represents an SOC of the target peak, $t_{k,T\ peak}$ represents the target time of the target peak, $t_{k,chrend}$ represents a charging ending time of the cell k, and $t_{k,disbegin}$ represents a discharging beginning time of the cell k.

Step C22: Determine, based on the charging ending $SOC_{k,end}$ of the cell k, the capacity $C_{k,chrend}$ by which the cell k is to be further charged when the charging ending moment of the battery cluster is reached and the capacity $C_{k,disend}$ by which the cell k is to be further discharged when the discharging ending moment of the battery cluster is reached, where the capacity $C_{k,chrend}$ by which the cell is to be further charged at the charging ending moment and the capacity $C_{k,disend}$ by which the cell is to be further discharged at the discharging ending moment satisfy:

$$C_{k,chrend} = (I - SOC_{k,end}) \times Q_{kmax};$$

$$C_{k,disbegin} = SOC_{k,end} \times Q_{kmax} - \int_{t_{k,begin}}^{t_{k,end}} I\ dt.$$

$t_{k,begin}$ represents a beginning time of the full charging/discharging process of the cell k, $t_{t,end}$ represents an ending time of the full charging/discharging process of the cell k, and I represents a current value in the full charging/discharging process.

In one embodiment of the present invention, after the charging ending $SOC_{k,end}$ is determined, the corresponding capacity parameter may be determined by using a relationship between the capacity parameter and $SOC_{k,end}$ and the maximum capacity $Q_{kmax}$. Specifically, based on FIG. 3, it may be learned that the maximum capacity $Q_{kmax}$ of the cell k corresponds to the SOC of 100%, an SOC corresponding to the capacity $C_{k,chrend}$ for further charging when the charging ending moment of the battery cluster is reached is $1-SOC_{k,end}$, and the capacity $C_{k,chrend}$ satisfies: $C_{k,chrend}=(1-SOC_{k,end})\times Q_{kmax}$.

In the full charging/discharging process, if the beginning time is $t_{k,begin}$, and the ending time is $t_{k,end}$, a battery level (a charging battery level or a discharging battery level) corresponding to the whole full charging/discharging process is $$\int_{t_{k,begin}}^{t_{k,end}} I \, dt,$$

a sum of which and the capacity $C_{k,disend}$ for further discharging at the discharging ending moment is the discharge capacity $C_{k,discharge}$, which corresponds to the charging ending $SOC_{k,end}$. Therefore, the capacity $C_{k,disend}$ satisfies:

$$C_{k,disend} = SOC_{k,end} \times Q_{kmax} - \int_{t_{k,begin}}^{t_{k,end}} I \, dt.$$

Similarly, if the capacity parameter includes the charge capacity and the discharge capacity, after the charging ending SOC is determined in step C21, step C2 of "determining the capacity parameters of the cells according to the first times, the first SOCs, the second times, and the second SOCs" may further include the following step:

Step C23: Determine a charge capacity $C_{k,charge}$ of the cell k and a discharge capacity $C_{k,discharge}$ of the cell k, where the charge capacity $C_{k,charge}$ and the discharge capacity $C_{k,discharge}$ satisfy:

$$C_{k,charge} = \int_{t_{k,begin}}^{t_{k,end}} I \, dt + (1 - SOC_{k,end}) \times Q_{kmax};$$

$$C_{k,discharge} = SOC_{k,end} \times Q_{kmax}.$$

In one embodiment of the present invention, as shown in FIG. 2, since the discharge capacity $C_{k,discharge}$ of the cell k corresponds to the charging ending $SOC_{k,end}$, the discharge capacity $C_{k,discharge}$ satisfies: $C_{k,discharge} = SOC_{k,end} \times Q_{kmax}$. Correspondingly, the charge capacity $C_{k,charge}$ includes the battery level corresponding to the full charging/discharging process and the capacity $C_{k,chrend}$ for further charging at the charging ending moment. Therefore, the charge capacity $C_{k,charge}$ satisfies:

$$C_{k,charge} = \int_{t_{k,begin}}^{t_{k,end}} I \, dt + C_{k,chrend},$$

that is $$C_{k,charge} = \int_{t_{k,begin}}^{t_{k,end}} I \, dt + (1 - SOC_{k,end}) \times Q_{kmax}.$$

It should be noted that, since the maximum capacity $Q_{kmax}$ may be divided into a plurality of parts, the capacity parameters determined in this embodiment may be expressed in a variety of forms. Since different forms are equivalent, this embodiment merely describes and defines a required logical relationship between the capacity parameters, and does not mean that the above formulas need to be used to calculate the corresponding capacity parameters in actual application. For example, since the discharge capacity $C_{k,discharge}$ satisfies: $C_{k,discharge} \, SOC_{k,end} \times Q_{kmax}$, $C_{k,discharge}$ may be directly determined by using the formula after $Q_{kmax}$ and $SOC_{k,end}$ of the cell k are determined. Alternatively, as shown in FIG. 2, since $$C_{k,discharge} = C_{k,disend} + \int_{t_{k,begin}}^{t_{k,end}} I \, dt,$$

$C_{k,discharge}$ may be calculated after $C_{k,disend}$ is determined. Although the actual processes of calculating $C_{k,discharge}$ are different, the processes are essentially the same. The calculated discharge capacities $C_{k,discharge}$ both satisfy $C_{k,discharge} = SOC_{k,end} \times Q_{kmax}$.

Optionally, in one embodiment of the present invention, a full charge time difference may also be used to represent the self-discharge status of the cell, that is, the self-discharge parameter includes the full charge time difference. The self-discharge parameter includes the full charge time difference, and the full charge time difference of the cell k in the battery cluster is a difference between a full charge time of the cell k and a full charge time of a reference cell in the battery cluster.

Figure 4:
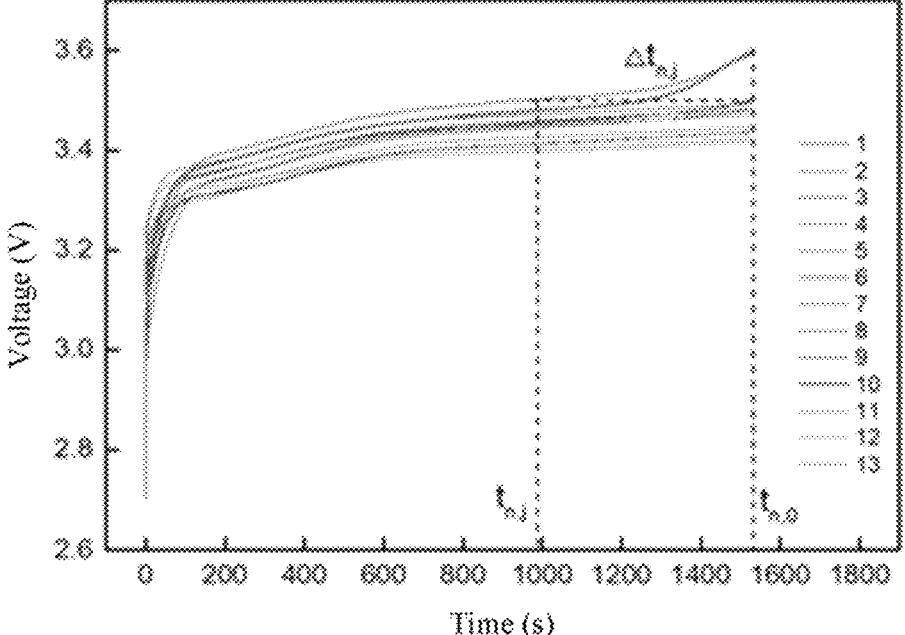
FIG. 4 is a schematic diagram of a charging curve according to an embodiment of the present invention.

In one embodiment of the present invention, the reference cell may be a cell corresponding to a median value of the voltage distribution in the battery cluster, or may be the earliest fully charged cell in the battery cluster. A charging curve of the each cell in the battery cluster may be determined, so that a difference $\Delta t$ between the full charge time of the each cell in the charging curve and the full charge time of the reference cell may be extracted. FIG. 4 shows charging curves of a plurality of cells, in which the cell corresponding to the median value of the voltage distribution in the battery cluster is used as the reference cell, the full charge time of the reference cell is $t_{n,0}$, and a full charge time of a cell j is $t_{n,j}$. Therefore, a difference $\Delta t_{n,j}$ between the reference cell and the cell j is a full charge time difference of the cell j. In addition, the cell j in FIG. 4 is the earliest fully charged cell, that is, the cell j may also be used as the reference cell.

Alternatively, the full charge time may be calculated based on the determined capacity parameter, so as to determine the full charge time difference. For example, a charge capacity $C_{k,charge}$ of the cell k represents a capacity corresponding to the cell k from beginning of charging to full charging. In a case that the whole full charging/discharging process uses a constant current (the current value is I), if the full charge time of the cell k is $t_{k,full}$, a calculation formula is $t_{k,full} = C_{k,charge}/I$. After the full charge time of the each cell is determined, the full charge time difference between the each cell and the reference cell may be determined. For example, the reference cell is the earliest fully charged cell, that is, the full charge time difference is relative to the shortest charge time. Assuming that the shortest charge time of all of the cells is $t_{min}$, the full charge time difference of the cell k is $\Delta t_k = t_{k,full} - t_{min}$.

In a normal situation, the full charge time difference $\Delta t$ relative to the reference cell should be in a Gaussian distribution, and there is a probability of 95% that the full charge time is within a range of $2\sigma$, where $\sigma$ is a mean square value of $\Delta t$. That is to say, if $\Delta t$ of a cell in the battery cluster is not within the range of $2\sigma$, there is a probability of 95% that the cell is abnormal. It is worth further exploring a root cause of the abnormality, which may mean that a self-discharge rate is on the high side in some occasions.

Based on the above embodiment, when a cell in the battery cluster is abnormal, operation and maintenance need to be performed on the cell, such as replacing the cell, or charging or discharging the cell to realize equalization, thereby improving the overall charging/discharging performance of the battery cluster. In one embodiment of the present invention, quantitative analysis of the operation and maintenance effects of the battery cluster can be realized based on the above capacity parameters. Step 103 of "performing operation and maintenance on the battery cluster" may include the following steps:

Step D1: Determine, according to a capacity by which each of the cells is to be further charged at a charging ending moment of the each cell, the earliest fully charged cell j in the battery cluster and the earliest fully charged cell j' other than the cell j.

Step D2: If the cell j is replaced, an effective charge capacity of the battery cluster is increased by $C_{j',chrend}$.

Step D3: If the cell j is discharged alone to an ending voltage after discharging of the battery cluster ends, the effective charge capacity of the battery cluster is increased by $\min[C_{j',chrend}, C_{j,disend}]$.

Alternatively, step 103 of "performing operation and maintenance on the battery cluster" may include the following steps:

Step E1: Determine, according to a capacity by which each of the cells is to be further discharged at a discharging ending moment of the each cell, the earliest fully discharged cell i in the battery cluster and the earliest fully discharged cell i' other than the cell i.

Step E2: If the cell i is replaced, an effective discharge capacity of the battery cluster is increased by $C_{i',disend}$.

Step E3: If the cell j is charged alone to an ending voltage after charging of the battery cluster ends, the effective discharge capacity of the battery cluster is increased by $\min[C_{i',disend}, C_{i,chrend}]$.

The main inconsistency between the different cells in the battery cluster lies in the different charge capacities and different discharge capacities of the different cells or the different capacities for further charging when the charging ending moment of the battery cluster is reached and the different capacities for further discharging when the discharging ending moment of the battery cluster is reached. That is to say, $C_{k,charge}$, $C_{k,discharge}$, $C_{k,chrend}$, and $C_{k,disend}$ may vary for a different cell k. In one embodiment of the present invention, after a full charging process or a full discharging process is performed on the battery cluster, the capacity parameters of the plurality of cells may be determined, and the capacity parameter of the each cell may be used to determine which cell is the earliest fully charged during the charging of the battery cluster and which cell is the earliest fully discharged during the discharging of the battery cluster.

Figure 5:
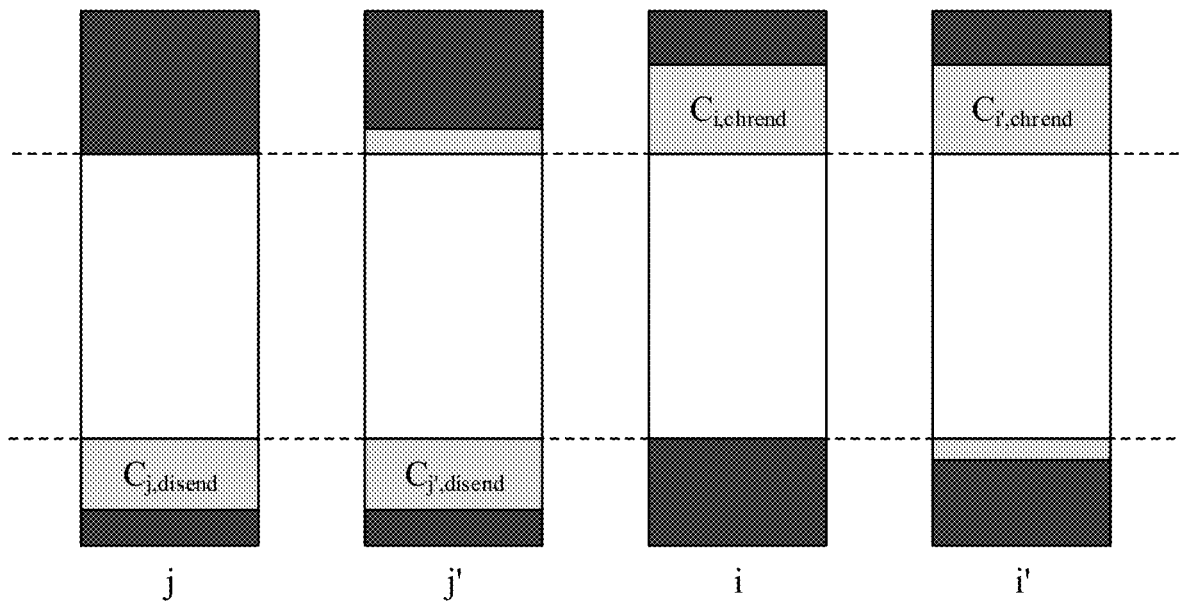
FIG. 5 is a schematic capacity distribution diagram of some cells in a battery cluster according to an embodiment of the present invention.

A smaller capacity by which the cell may be further charged when the charging ending moment of the battery cluster is reached means an earlier time the cell can be fully charged, that is, the cell with the minimum capacity $C_{k,chrend}$ is the earliest fully charged. For example, if the capacity $C_{j,chrend}$ by which the cell j may be further charged when the charging ending moment of the battery cluster is reached is the smallest, the cell j in the battery cluster is the earliest fully charged. Similarly, a smaller capacity by which the cell may be further discharged when the discharging ending moment of the battery cluster is reached means an earlier time the cell may be fully discharged, that is, the cell with the minimum capacity $C_{k,disend}$ is the earliest fully discharged. For example, if the capacity $C_{i,disend}$ by which the cell i may be further discharged when the discharging ending moment of the battery cluster is reached is the smallest, the cell i in the battery cluster is the earliest fully discharged. In general, if the cell j is the earliest fully charged, $C_{j,chrend}=0$. If the cell i is the earliest fully discharged, $C_{i,disend}=0$. Based on the same principle, a second earliest fully charged cell, that is, the earliest fully charged cell j' other than the cell j, may be determined, and $C_{j',chrend}$ is the second smallest. A second earliest fully discharged cell, that is, the earliest fully discharged cell j' other than the cell j, may be determined, and $C_{j',chrend}$ is the second smallest. A capacity diagram of the cells j, j', i, and i' may be shown in FIG. 5. It may be understood by those skilled in the art that, since the currents I of the different cells in the full charging/discharging process of the battery cluster are the same, and the beginning times $t_{k,begin}$ and the ending times $t_{k,end}$ of the full charging/discharging processes of the different cells are the same, the capacities $$\int_{t_{k,begin}}^{t_{k,end}} I \, dt$$

of the different cells are the same. However, different from the capacities of the whole cells, the battery levels of the different cells may be different at the beginning time or the ending time. In FIG. 5, the capacities $$\int_{t_{k,begin}}^{t_{k,end}} I \, dt$$

of the different cells are aligned with each other merely for facilitating comparison.

Figure 6:
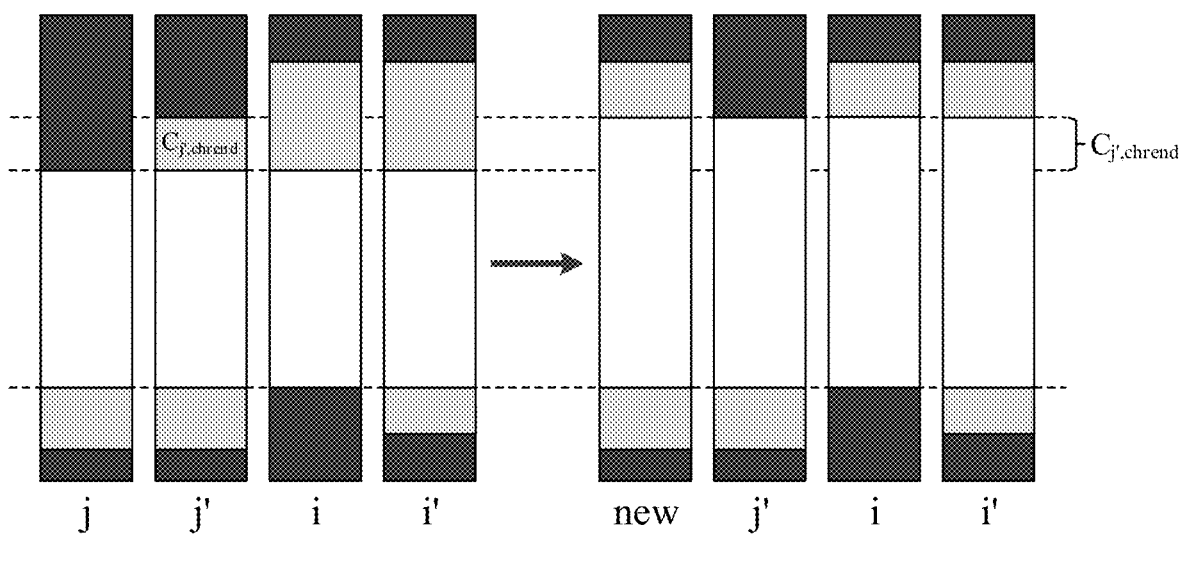
FIG. 6 is a schematic diagram of a capacity improvement through replacement of a cell according to an embodiment of the present invention.

If the cell j is the earliest fully charged, the cell may be normal or abnormal. If the cell j is abnormal, and the cell j is replaced, that is, the cell j is replaced with a new healthy cell, the cell j' in the battery cluster after the replacement is the earliest fully charged. During charging of the battery cluster after the replacement, the cell j' can be fully charged, that is, at this time, the capacity by which the cell j' may be further charged when the charging ending moment of the battery cluster is reached is zero. In other words, the battery cluster after the replacement may be charged by an additional battery level of $C_{j',chrend}$ compared with the previous battery cluster, that is, the effective charge capacity of the battery cluster can be increased by $C_{j',chrend}$. The improvement of the effective charge capacity of the battery cluster after the cell j is replaced with the new cell may be shown in FIG. 6.

Figure 7:
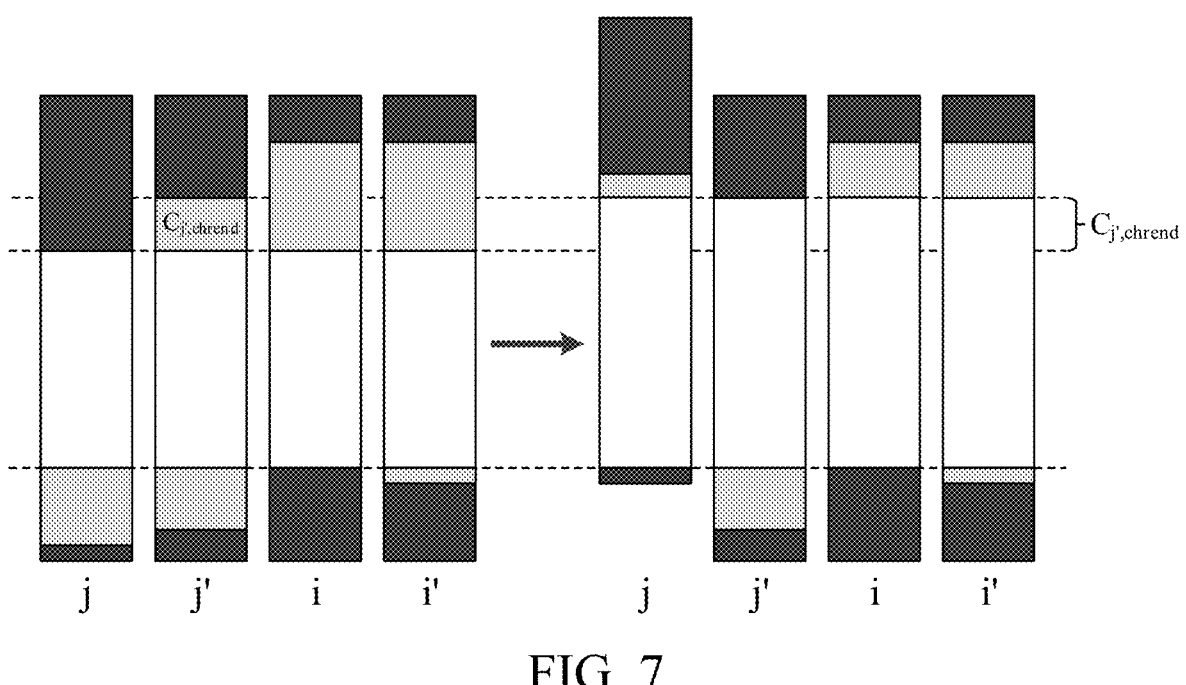
FIG. 7 is a schematic diagram of a capacity improvement through discharge of a cell alone according to an embodiment of the present invention.
Figure 8:
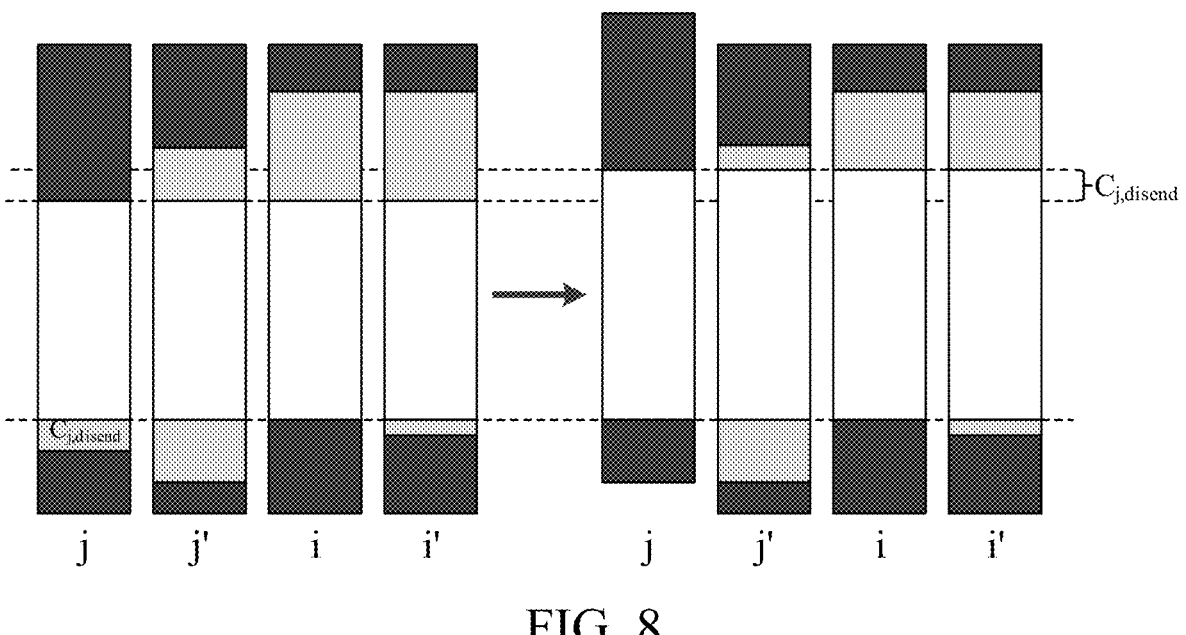
FIG. 8 is another schematic diagram of a capacity improvement through discharge of a cell alone according to an embodiment of the present invention.

Alternatively, when the cell j is still available, for example, when the health of the cell j still satisfies the use requirements, the cell j may not be replaced. At this time, the cell j may be discharged to reduce the inconsistency between the cells in the battery cluster, thereby realizing equalization. Specifically, the cell j may be discharged alone to the ending voltage. For example, the battery cluster may be discharged to the discharging ending voltage of the battery cluster. Then the cell j may be discharged alone to an ending voltage of the cell j, so that an SOC of the cell j is $SOC_j=0$. During subsequent charging of the battery cluster, the cell j may be charged starting from the SOC of zero until the battery cluster is fully charged. In this case, the full charge of the battery cluster depends on whether the capacity $C_{j,disend}$ by which the cell j may be further discharged when the discharging ending moment of the battery cluster is reached or the capacity $C_{j',chrend}$ by which the cell j' may be further charged when the charging ending moment of the battery cluster is reached is larger or smaller before the batter cell j is discharged alone. Referring to FIG. 7, if $C_{j,disend}$ is greater than $C_{j',chrend}$, the cell j' is fully charged earlier, and therefore the effective charge capacity of the battery cluster is increased by $C_{j',chrend}$. Alternatively, as shown in FIG. 8, if $C_{j,disend}$ is less than $C_{j',chrend}$, the cell j is fully charged earlier, and therefore the effective charge capacity of the battery cluster is increased by $C_{j,disend}$. That is to say, the effective charge capacity of the battery cluster is increased by $\min[C_{j',chend}, C_{j,disend}]$. This equalization method, which can improve the effective charge capacity of the battery cluster, may be referred to as charging equalization.

Similarly, the effective discharge capacity of the battery cluster may be improved by replacing the earliest fully discharged cell i or charging the cell alone, and quantitative analysis of the improvement of the effective discharge capacity may be realized through the capacity parameters determined in this embodiment.

If the cell i is replaced, that is, the cell i' in the battery cluster after the replacement is the earliest fully discharged. During discharging of the battery cluster after the replacement, the cell i' can be fully discharged, that is, at this time, the capacity by which the cell i' may be further discharged when the discharging ending moment of the battery cluster is reached is zero. In other words, the battery cluster after the replacement may be discharged by an additional battery level of $C_{i',chrend}$ compared with the previous battery cluster, that is, the effective discharge capacity of the battery cluster can be increased by $C_{i',chrend}$.

Alternatively, when the cell i is still available, for example, when the health of the cell i still satisfies the use requirements, the cell i may not be replaced. At this time, the cell i may be charged to reduce the inconsistency between the cells in the battery cluster, thereby realizing equalization. Specifically, the cell i may be charged alone to the ending voltage. For example, the battery cluster may be charged to the charging ending voltage of the battery cluster. Then the cell i may be charged alone to an ending voltage of the cell i, so that an SOC of the cell i is $SOC_i=100\%$. During subsequent discharging of the battery cluster, the cell i may be discharged starting from the SOC of 100% until the battery cluster is fully discharged. In this case, the full discharge of the battery cluster depends on whether the capacity $C_{i,chrend}$ by which the cell i may be further charged when the charging ending moment of the battery cluster is reached or the capacity $C_{i',disend}$ by which the cell i' may be further discharged when the discharging ending moment of the battery cluster is reached is larger or smaller before the batter cell i is charged alone. If $C_{i,chrend}$ is greater than $C_{i',disend}$, the cell i' is fully discharged earlier, and therefore the effective discharge capacity of the battery cluster is increased by $C_{i',disend}$. Alternatively, if $C_{i,chrend}$ is less than $C_{i',disend}$, the cell i is fully discharged earlier, and therefore the effective discharge capacity of the battery cluster is increased by $C_{i,chrend}$. That is to say, the effective discharge capacity of the battery cluster is increased by $\min[C_{i,chrend}, C_{i',disend}]$. This equalization method, which can improve the effective discharge capacity of the battery cluster, may be referred to as discharging equalization.

The effective charge capacity of the battery cluster is a capacity by which the battery cluster that is fully discharged may be charged, and the effective discharge capacity of the battery cluster is a capacity by which the battery cluster that is fully charged may be discharged.

In addition, it should be noted that in some battery clusters, it is difficult to replace or charge/discharge a single cell. At this time, a battery module where an abnormal cell is located may be replaced or charged/discharged. The second fully charged cell j' or the second fully discharged cell i' that is determined is a cell other than the battery module where the abnormal cell is located. For example, the "earliest fully charged cell j' other than the charged cell j'" is the earliest fully charged cell j' other than a battery module where the cell j is located, that is, the cell j and the cell j' are not in the same battery module. The "earliest fully discharged cell i' other than the discharged cell i'" is the earliest fully discharged cell i' other than a battery module where the cell i is located, that is, the cell i and the cell i' are not in the same battery module.

In one embodiment of the present invention, the capacity parameters of the plurality of cells are used, so that the operation and maintenance effect can be quantitated when replacing or equalizing the battery cluster, thereby accurately evaluating the rationality of the operation and maintenance solution.

Optionally, in one embodiment of the present invention, accurate operation and maintenance can be realized based on the KBPs. Step 103 of "performing operation and maintenance on the battery cluster" may include the following steps:

Step F1: Charge the cell k alone to an ending voltage in a case that the full charge time difference of the cell k is abnormal and the internal resistance is normal.

Step F2: Discharge the cell k alone to an ending voltage in a case that the internal resistance of the cell k is abnormal and the full charge time difference is normal.

In one embodiment of the present invention, the expression "the full charge time difference is abnormal" means that the full charge time difference is relatively large and has a relatively large full charge time difference with the other cells. For the cell k, if the full charge time difference $\Delta t_k$ is abnormal, it indicates that the cell k is still not fully charged, or it indicates that the cell k is fully discharged earlier than others during discharging, and self-discharge of the cell k is abnormal. In addition, if the internal resistance $R_k$ of the cell k is normal, it indicates that the cell k is not seriously deteriorated. At this time, charging the cell k alone may increase the capacity of the whole cluster (group). Therefore, the cell k may be charged alone, so that the cell k can be fully charged or approximately fully charged, which reduces the full charge time difference. Specifically, the cell k may be charged alone to the ending voltage after the charging of the battery cluster ends. For example, the battery cluster may be charged to the charging ending voltage of the battery cluster. Then the cell k may be charged alone to an ending voltage of the cell k, so that an SOC of the cell k is $SOC_k=100\%$.

If charging the cell alone only generates a temporary improvement or a limited improvement, it indicates that the cell k has an unrecoverable problem regarding self-discharge (for example, lithium dendrites have been formed). At this time, the cell k may be replaced.

If the full charge time difference $\Delta t_k$ of the cell k is normal, it indicates that the capacity consistency of the battery cluster is relatively desirable. If the internal resistance $R_k$ of the cell k is abnormal, the increasing internal resistance will result in too fast charging. Therefore, the cell is usually the earliest fully charged in the whole cluster, and needs to be discharged to increase the effective capacity of the whole cluster (group). In one embodiment of the present invention, the cell k may be discharged alone to the ending voltage after the discharging of the battery cluster ends, so as to improve the capacity of the battery cluster. For example, the battery cluster may be discharged to the discharging ending voltage of the battery cluster. Then the cell k may be discharged alone to the ending voltage of the cell k, so that an SOC of the cell k is $SOC_k=0$.

If the internal resistance $R_k$ and the full charge time difference $\Delta t_k$ of the cell k are both abnormal, the cell k may be replaced for maintenance. Alternatively, a two-dimensional normal distribution of the internal resistance and the full charge time difference may be used for more precise determination whether to replace or equalize (such as the above charge equalization and discharge equalization) the cell k when the internal resistance $R_k$ and the full charge time difference $\Delta t_k$ are both abnormal.

Specific application examples of the present invention are disclosed as follows:

Example 1

A universal 2 parallel 12 series lithium iron phosphate cascade battery pack (including No. 1, No. 2, . . . , No. 11, No. 12) with a capacity of 33.8 Ah is used as a test object. A charging ending voltage is 3.6 V, a discharging ending voltage is 2.7 V, a charging current is 1 C, and a discharging current is 0.2 C. A test device arbin evts 600V/300 A and a temperature control box TU410-5 are used for the test, and a temperature range is −20° C. to +130° C. A temperature during the whole test is constant at 25° C.

Figure 9:
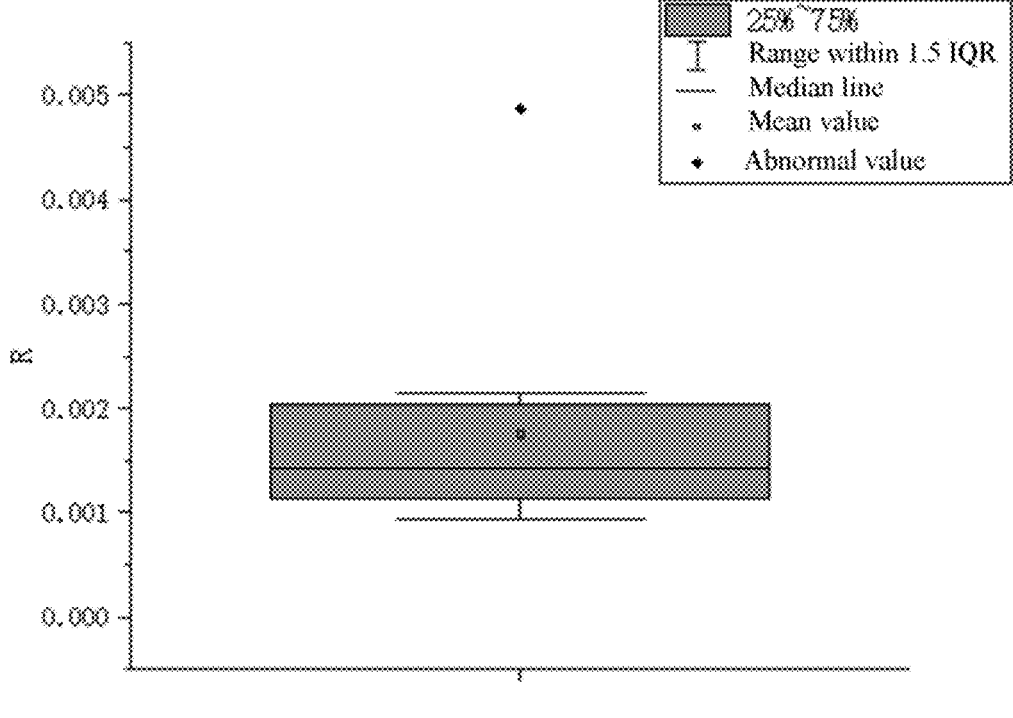
FIG. 9 is a box plot of a plurality of internal resistances in Application example I according to an embodiment of the present invention.
Figure 10:
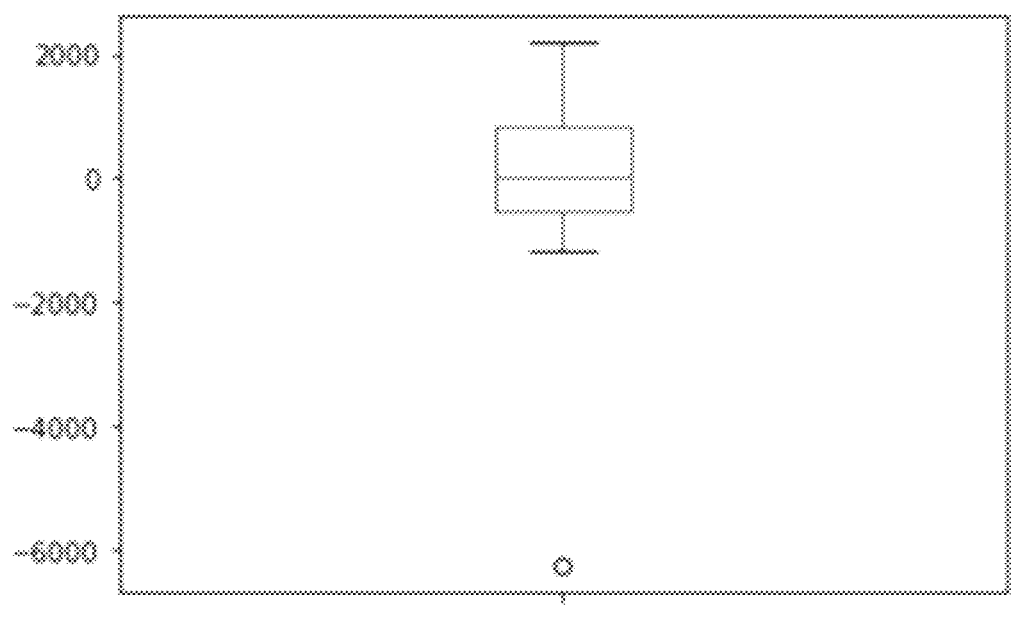
FIG. 10 is a box plot of a plurality of full charge time differences in Application example I according to an embodiment of the present invention.

KBPs such as an internal resistance, a capacity parameter, and a full charge time difference of each cell are obtained from dQ/dV The internal resistance of the each cell in the battery pack is shown in FIG. 9. It is found that the internal resistance of a cell 2 exceeds a threshold calculated and analyzed by a model. The full charge time difference $\Delta t$ of each cell in the battery pack is shown in FIG. 10. It is found that a charging time of the cell 2 exceeds a threshold calculated and analyzed by the model, and the cell 2 is the earliest fully charged and discharged cell. Therefore, it is difficult to realize equalization, and the cell 2 needs to be replaced. In addition to the cell 2, the cell 5 is the earliest fully discharged, and may be further discharged by a capacity of $C_{5,disend}=4.141180371$ Ah at a discharging ending moment. Therefore, after the cell 2 is replaced, an effective discharge capacity of the lithium iron phosphate cascade battery pack is increased by 4.141180371 Ah. That is to say, the battery pack may be discharged by additional 4.141180371 Ah, and a discharge capacity of the battery pack is increased by 4.141180371/33.8=12.57%. Moreover, the cell 5 is the earliest fully charged other than the cell 2, and may be further charged by a capacity of $C_{5,chrend}=9.101463607$ Ah at a charging ending moment. Therefore, a charge capacity of the battery pack is increased by 9.101463607/33.8=26.96%.

Example 2

A State-Grid 1 parallel 16 series lithium iron phosphate cascade battery pack (including No. 1, No. 2, . . . , No. 15, No. 16) with a capacity of 21.7 Ah is used as a test object. A charging ending voltage is 3.6 V, a discharging ending voltage is 2.7 V, a charging current is 0.7 C, and a discharging current is 0.7 C. A battery module charging/discharging test system of Qingdao Dikaron 100V/300 A and an environmental simulation test box of Espec battery module are used for the test, and a temperature range is −40° C. to +100° C. A temperature during the whole test is constant at 25° C.

Figure 11:
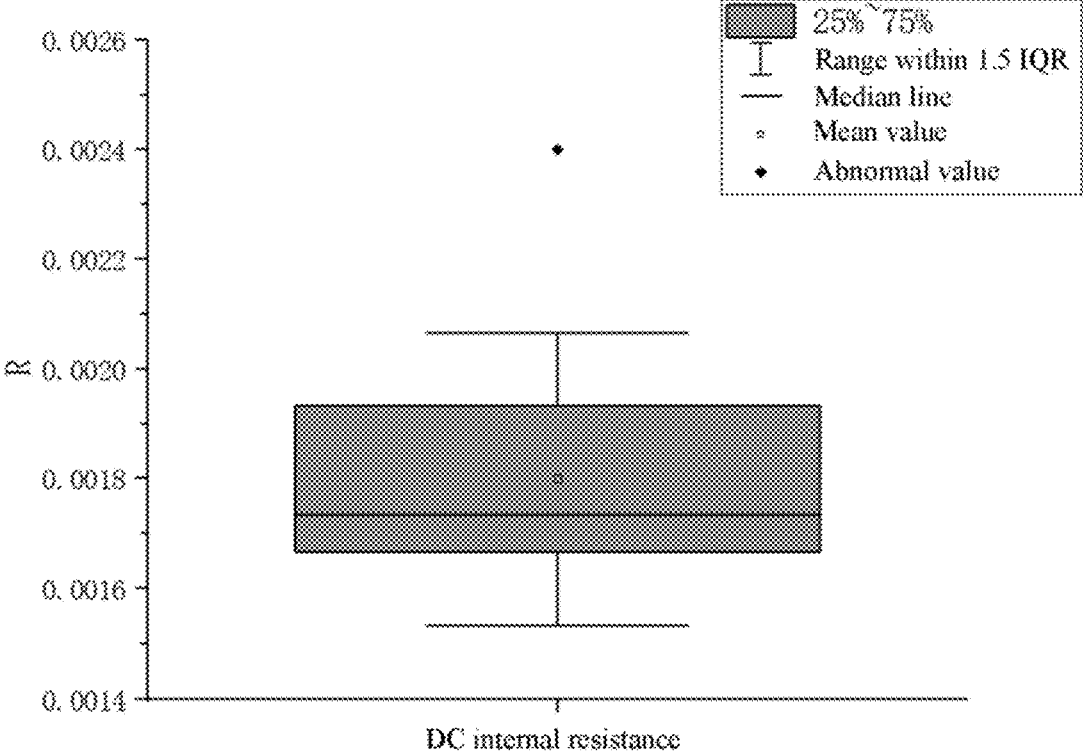
FIG. 11 is a box plot of a plurality of internal resistances in Application example II according to an embodiment of the present invention.
Figure 12:
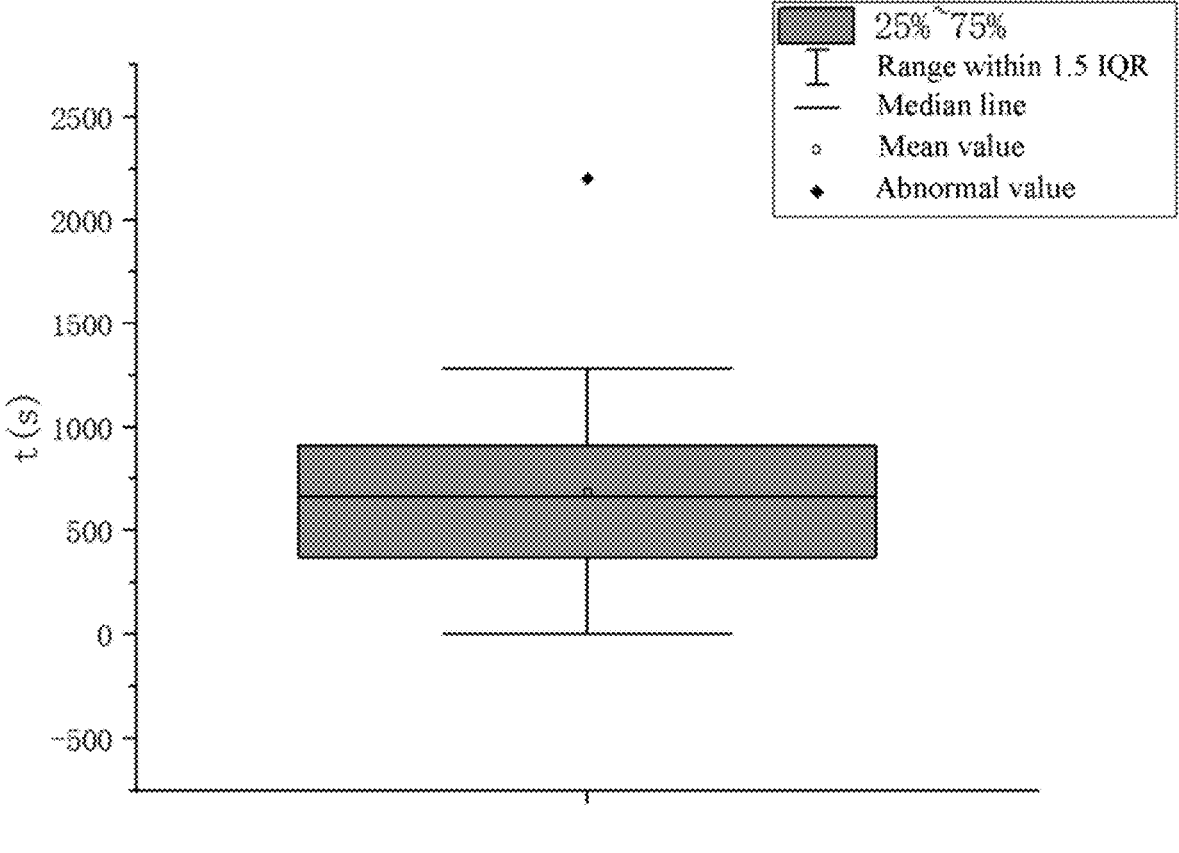
FIG. 12 is a box plot of a plurality of full charge time differences in Application example II according to an embodiment of the present invention.

KBPs such as an internal resistance, a capacity parameter, and a full charge time difference of each cell are obtained from dQ/dV The internal resistance of the each cell in the battery pack is shown in FIG. 11. It is found that the internal resistance of a cell 15 exceeds a threshold calculated and analyzed by a model. The full charge time difference $\Delta t$ of the each cell in the battery pack is shown in FIG. 12. It is found that a charging time of a cell 13 exceeds a threshold calculated and analyzed by the model. The relevant KBPs show different abnormal cells. Therefore, the overall capacity of the battery module may be improved through equalization. It is found through analysis that the cell 13 is the earliest fully discharged, and may be further discharged by a capacity of $C_{13,disend}=0$ Ah at a discharging ending moment. In addition to the cell 13, the cell 16 is the earliest fully discharged, and the cell 16 may be further discharged by a capacity of $C_{16,disend}=7.8$ Ah at the discharging ending moment. A capacity by which the cell 13 may be further charged at a charging ending moment is $C_{13,chrend}=9.165$ Ah, which is greater than $C_{16,disend}$. It is found through calculation that after the cell 13 is equalized, that is, after the battery pack is charged to an ending voltage (at this time, the cell 13 is not fully charged and may be further charged by 9.165 Ah), the cell 13 is charged alone by an additional battery level greater than 7.8 Ah. For example, the cell 13 is charged to the ending voltage. At this time, the whole battery pack is discharged. An overall discharge capacity can be increased by 7.8 Ah, and a discharge capacity of the whole battery pack can be increased by 7.8/21.7=35.9%.

The method for battery operation and maintenance provided in the embodiments of the present invention is described in detail above and the method may be implemented by a corresponding apparatus. The apparatus for batter operation and maintenance provided in the embodiments of the present invention is described in detail below.

Figure 13:
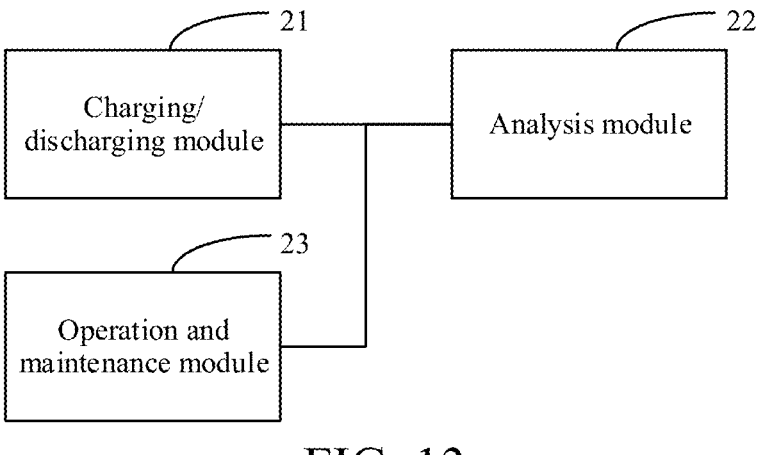
FIG. 13 is a schematic structural diagram of an apparatus for batter operation and maintenance according to an embodiment of the present invention.

FIG. 13 is a schematic structural diagram of an apparatus for batter operation and maintenance according to an embodiment of the present invention. As shown in FIG. 13, the apparatus for batter operation and maintenance includes:

a charging/discharging module 21, configured to perform a charging/discharging process on a to-be-analyzed battery cluster, and determine KBPs of a plurality of cells in the battery cluster, where the KBPs include an internal resistance, a capacity parameter, and a self-discharge parameter;

an analysis module 22, configured to determine whether the battery cluster is abnormal depending on whether the KBPs of the cells in the battery cluster exceed a normal range; and an operation and maintenance apparatus module 23, configured to operate and maintain the battery cluster in a case that the battery cluster is abnormal.

Based on the above embodiment, the determination whether the battery cluster is abnormal by the analysis module 22 includes:

presetting a corresponding abnormality threshold for each of the KBPs; and determining that the cells in the battery cluster are abnormal in a case that the KBPs of the cells exceed the abnormality threshold.

Based on the above embodiment, the abnormality threshold is a threshold determined according to a KBP in historical operation data or a safety parameter provided by a manufacturer; or

the abnormality threshold $r_{th}$ is: $r_th=(r_1+r_0)/2+\sigma^2 \ln \lambda(r_1-r_0)$, where $r_1$ is a value corresponding to a determination that the KBP is abnormal, $r_0$ and G respectively represent an average value and a mean square difference of a data stream transmitted when the KBPs are normal, and $\lambda$ is a preset coefficient related to a confidence level.

Based on the above embodiment, the determination whether the battery cluster is abnormal by the analysis module 22 includes:

determining whether the KBPs of the plurality of cells exceed a normal distribution range according to a distribution of the KBPs of the cells; and determining that the cells are abnormal in a case that the KBPs of the cells exceed the normal distribution range.

Based on the above embodiment, the operation and maintenance of the battery cluster by the operation and maintenance module 23 includes:

dynamically adjusting a charging/discharging control parameter of the battery cluster in a case that the battery cluster is in a sub-healthy state;

equalizing the battery cluster if a capacity allowed to be increased that is determined based on the capacity parameter is greater than a preset capacity in a case that the battery cluster is in the sub-healthy state; and enabling/disabling the battery cluster in a case that the battery cluster is in a faulty state.

Based on the above embodiment, the self-discharge parameter includes a full charge time difference, and the full charge time difference of a cell k in the battery cluster is a difference between a full charge time of the cell k and a full charge time of a reference cell in the battery cluster.

Based on the above embodiment, the operation and maintenance of the battery cluster by the operation and maintenance module 23 includes:

discharging the cell k alone to an ending voltage in a case that the full charge time difference of the cell k is abnormal and the internal resistance is normal; and charging the cell k alone to an ending voltage in a case that the internal resistance of the cell k is abnormal and the full charge time difference is normal.

Based on the above embodiment, the charging/discharging process on the to-be-analyzed battery cluster and determination of the KBPs of the plurality of cells in the battery cluster by the charging/discharging module 21 includes:

performing a full charging/discharging process on a to-be-analyzed battery cluster, and determining differential capacities versus voltage of the plurality of cells in the battery cluster at different times, where a constant current exists in at least part of a time period of the full charging/discharging process; and determining first times and first SOCs when the differential capacities versus voltage of the cells reach a first peak and second times and second SOCs when the differential capacities versus voltage of the cells reach a second peak, and determining capacity parameters of the cells according to the first times, the first SOCs, the second times, and the second SOCs, where the second SOCs are greater than the first SOCs; and Based on the above embodiment, the capacity parameter of a cell k in the battery cluster includes a capacity $C_{k,chrend}$ by which the cell k is to be further charged when a charging ending moment of the battery cluster is reached and a capacity $C_{k,disend}$ by which the cell k is to be further discharged when a discharging ending moment of the battery cluster is reached.

Based on the above embodiment, the operation and maintenance of the battery cluster by the operation and maintenance module 23 includes:

determining, according to a capacity by which each of the cells is to be further charged at a charging ending moment of the each cell, the earliest fully charged cell j in the battery cluster and the earliest fully charged cell j' other than the cell j, where if the cell j is replaced, an effective charge capacity of the battery cluster is increased by $C_{j',chrend}$; and if the cell j is discharged alone to an ending voltage, the effective charge capacity of the battery cluster is increased by $\min[C_{j',chrend}, C_{j,disend}]$.

Based on the above embodiment, the operation and maintenance of the battery cluster by the operation and maintenance module 23 includes:

determining, according to a capacity by which each of the cells is to be further discharged at a discharging ending moment of the each cell, the earliest fully discharged cell i in the battery cluster and the earliest fully discharged cell i' other than the cell i, where if the cell i is replaced, an effective discharge capacity of the battery cluster is increased by $C_{i',disend}$; and if the cell j is charged alone to an ending voltage, the effective discharge capacity of the battery cluster is increased by $\min[C_{i',disend}, C_{i,chrend}]$.

Based on the above embodiment, in a case that the full charging/discharging process includes a full charging process, in the full charging process, the constant current exists in at least a time period from a charging beginning time to a largest one of the second times of the plurality of cells, and the full charging process begins when the battery cluster reaches a discharging ending voltage and ends when the battery cluster reaches a charging ending voltage; and in a case that the full charging/discharging process includes a full discharging process, in the full discharging process, the constant current exists in at least a time period from a smallest one of the second times of the plurality of cells to a discharging ending time, and the full discharging process begins when the battery cluster reaches the charging ending voltage and ends when the battery cluster reaches the discharging ending voltage.

Based on the above embodiment, the determination of the capacity parameters of the cells by the charging/discharging module 21 according to the first times, the first SOCs, the second times, and the second SOCs includes:

determining, according to a first $SOC_{k,I\ peak}$ and a second $SOC_{k,II\ peak}$ of the cell k in the battery cluster, a difference $\Delta SOC_k$ between the SOCs of the cell k when reaching the first peak and the second peak, where $\Delta SOC_k=SOC_{k,II\ peak}-SOC_{k,I\ peak}$; and determining a difference $\Delta Q_k$ between capacities of the cell k when reaching the first peak and the second peak, and determining a maximum capacity $Q_{kmax}$ of the cell k, where $Q_{kmax}=100\%\times\Delta Q_k/\Delta SOC_k$.

Based on the above embodiment, the determination of the capacity parameters of the battery cells by the charging/discharging module 21 according to the first times, the first SOCs, the second times, and the second SOCs further includes:

determining a charging ending $SOC_{k,end}$ of the cell k at the charging ending moment of the battery cluster according to a target time and a target SOC when the cell k reaches a target peak and the maximum capacity $Q_{kmax}$ of the cell k, where the target peak is the first peak or the second peak, and the target time is the corresponding first time or second time; and determining, based on the charging ending $SOC_{k,end}$ of the cell k, the capacity $C_{k,chrend}$ by which the cell k is to be further charged when the charging ending moment of the battery cluster is reached and the capacity $C_{k,disend}$ by which the cell k is to be further discharged when the discharging ending moment of the battery cluster is reached, where the capacity $C_{k,chrend}$ by which the cell is to be further charged at the charging ending moment and the capacity $C_{k,disend}$ by which the cell is to be further discharged at the discharging ending moment satisfy:

$$C_{k,chrend} = (1 - SOC_{k,end}) \times Q_{kmax};$$

$$C_{k,disend} = SOC_{k,end} \times Q_{kmax} - \int_{t_{k,begin}}^{t_{k,end}} I \, dt,$$

where where $t_{k,begin}$ represents a beginning time of the full charging/discharging process of the cell k, $t_{k,end}$ represents an ending time of the full charging/discharging process of the cell k, and I represents a current value in the full charging/discharging process.

Based on the above embodiment, the determination of the capacity parameters of the battery cells by the charging/discharging module 21 according to the first times, the first SOCs, the second times, and the second SOCs further includes:

determining a charge capacity $C_{k,charge}$ of the cell k and a discharge capacity $C_{k,discharge}$ of the cell k, where the charge capacity $C_{k,charge}$ and the discharge capacity $C_{k,discharge}$ satisfy:

$$C_{k,charge} = \int_{t_{k,begin}}^{t_{k,end}} I \, dt + (1 - SOC_{k,end}) \times Q_{kmax};$$

$$C_{k,discharge} = SOC_{k,end} \times Q_{kmax}.$$

Based on the above embodiment, in a case that the full charging/discharging process includes the full charging process, the charging ending $SOC_{k,end}$ of the cell k satisfies:

$$SOC_{k,end} = SOC_{k,T\ peak} + \int_{t_{k,T\ peak}}^{t_{k,chrend}} I \, dt/Q_{kmax};$$

in a case that the full charging/discharging process includes the full discharging process, the charging ending $SOC_{k,end}$ of the cell k satisfies:

$$SOC_{k,end} = SOC_{k,T\ peak} + \int_{t_{k,disbegin}}^{t_{k,T\ peak}} I \, dt/Q_{kmax};$$

where $SOC_{k,T\ peak}$ represents an SOC of the target peak, $t_{k,T\ peak}$ represents the target time of the target peak, $t_{k,chrend}$ represents a charging end time of the cell k, and $t_{k,disbegin}$ represents a discharging begin time of the cell k.

In addition, an embodiment of the present invention further provides an electronic device, including a bus, a transceiver, a memory, a processor, and a computer program stored on the memory and runnable on the processor. The transceiver, the memory, and the processor are connected through the bus. When the computer program is executed by the processor, all processes of the embodiment of the method for battery operation and maintenance are implemented, and the same technical effects can be achieved. To avoid repetition, details are not described herein again.

Figure 14:
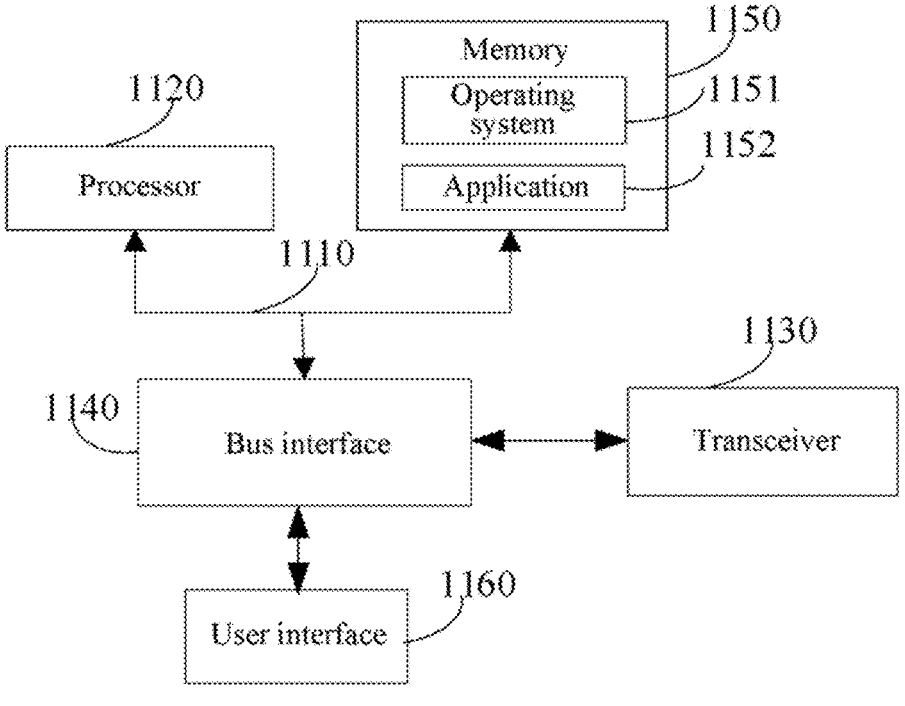
FIG. 14 is a schematic structural diagram of an electronic device for performing the method for battery operation and maintenance according to an embodiment of the present invention.

Specifically, as shown in FIG. 14, an embodiment of the present invention further provides an electronic device. The electronic device includes a bus 1110, a processor 1120, a transceiver 1130, a bus interface 1140, a memory 1150, and a user interface 1160.

In one embodiment of the present invention, the electronic device further includes a computer program stored in the memory 1150 and runnable on the processor 1120. When the computer program is executed by the processor 1120, all processes of the embodiment of the method for battery operation and maintenance are implemented.

The transceiver 1130 is configured to receive and transmit data under control of the processor 1120.

In one embodiment of the present invention, a bus architecture is represented by the bus 1110. The bus 1110 may include any number of interconnected buses and bridges, and the bus 1110 connects together various circuits including one or more processors represented by the processor 1120 and memories represented by the memory 1150.

The bus 1110 is one or more of any type of bus structures in a plurality of types of bus structures, including a memory bus and a memory controller, a peripheral bus, an accelerate graphical port (AGP), a processor, or a local bus using any bus structure in various bus architectures. As an example rather than a limitation, such architecture includes an industry standard architecture (ISA) bus, a micro channel architecture (MCA) bus, an enhanced ISA (EISA) bus, a video electronics standards association (VESA) bus, and a peripheral component interconnect (PCI) bus.

The processor 1120 may be an integrated circuit chip and has a signal processing capability. During the implementation, each step of the above method embodiment may be completed by using an integrated logic circuit of hardware in the processor or an instruction in a form of software. The above processor includes a general processor, a central processing unit (CPU), a network processor (NP), a digital signal processor (DSP), an application specific integrated circuit (ASIC), a field programmable gate array (FPGA), a complex programmable logic device (CPLD), a programmable logic array (PLA), a microcontroller unit (MCU) or other programmable logic devices, a discrete gate, a transistor logic device, and a discrete hardware component. The processor may implement or execute various methods, steps, and logic block diagrams disclosed in the embodiments of the present invention. For example, the processor may be a single cell processor or a multi-core processor, and may be integrated on a single chip or located on a plurality of different chips.

The processor 1120 may be a microprocessor or any conventional processor. The steps of the method disclosed in combination with the embodiments of the present invention may be directly performed by a hardware decoding processor, or may be performed by a combination of hardware and software modules in the decoding processor. The software module may be located in a readable storage medium known in the art, such as a random access memory (RAM), a flash memory, a read only memory (ROM), a programmable ROM (PROM), an erasable PROM (EPROM), or a register. The readable storage medium is located in the memory, and the processor reads information in the memory and completes the steps of the above method in combination with hardware of the processor.

The bus 1110 may further connect together various other circuits such as a peripheral device, a voltage regulator, or a power management circuit. The bus interface 1140 provides an interface between the bus 1110 and the transceiver 1130, which is well known in the art. Therefore, the above is not further described in one embodiment of the present invention.

The transceiver 1130 may be one element or a plurality of elements, such as a plurality of receivers and transmitters, which provides a unit for communication with various other apparatuses on a transmission medium. For example, the transceiver 1130 receives external data from the other devices, and the transceiver 1130 is configured to transmit data processed by the processor 1120 to the other devices. Depending on properties of a computer system, a user interface 1160 such as a touch screen, a physical keyboard, a display, a mouse, a speaker, a microphone, a trackball, a joystick, and a stylus may be further provided.

It should be understood that in one embodiment of the present invention, the memory 1150 may further include memories remotely disposed relative to the processor 1120, which may be connected to a server via a network. One or more parts of the above network may be an ad hoc network, an intranet, an extranet, a virtual private network (VPN), a local area network (LAN), a wireless local area network (WLAN), a wide area network (WAN), a wireless wide area network (WWAN), a metropolitan area network (MAN), the Internet, a public switched telephone network (PSTN), a plain old telephone service (POTS) network, a cellular telephone network, a wireless network, a Wi-Fi network, and a combination of two or more of the above networks. For example, the cellular telephone network and the wireless network may be global systems for mobile communications (GSM), code division multiple access (CDMA) systems, world interoperability for microwave access (WiMAX) systems, general packet radio service (GPRS) systems, broadband code division multiple access (WCDMA) systems, long-term evolution (LTE) systems, LTE frequency division duplex (FDD) systems, LTE time division duplex (TDD) systems, LTE-advanced (LTE-A) systems, universal mobile telecommunication systems (UMTS), enhanced mobile broadband (eMBB) systems, massive machine type of communication (mMTC) systems, ultra reliable low latency communications (uRLLC) systems, or the like.

It should be noted that, the memory 1150 in one embodiment of the present invention may be a volatile memory or a non-volatile memory, or may include both a volatile memory and a non-volatile memory. The non-volatile memory may include a read-only memory (ROM), a programmable ROM (PROM), an erasable PROM (EPROM), an electrically EPROM (EEPROM), or a flash memory.

The volatile memory may include a random access memory (RAM) that serves as an external cache. By way of example but not limitation, many forms of RAMs are available, such as a static RAM (SRAM), a dynamic RAM (DRAM), a synchronous DRAM (SDRAM), a double data rate SDRAM (DDRSDRAM), an enhanced SDRAM (ESDRAM), a synchlink DRAM (SLDRAM), and a direct rambus RAM (DRRAM). The memory 1150 of the electronic device described in one embodiment of the present invention includes but is not limited to the above memories and any other suitable type of memories.

In one embodiment of the present invention, the memory 1150 stores the following elements of an operating system 1151 and an application program 1152: an executable module, a data structure, or a subset thereof, or an extended set thereof.

Specifically, the operating system 1151 includes various system programs, such as a framework layer, a cell library layer, and a driver layer, which are configured to implement various basic services and processing a task based on hardware. The application 1152 includes various applications such as a media player and a browser for implementing various application services. A program implementing the method of the embodiments of the present invention may be included in the application 1152. The application 1152 includes applets, objects, components, logic, data structures, and other computer system executable instructions for performing specific tasks or implementing specific abstract data types.

In addition, the embodiments of the present invention further provide a computer-readable storage medium, storing a computer program, where when executed by a processor, the computer program implements the processes of the embodiment of the method for battery operation and maintenance, and can achieve the same technical effects. To avoid repetition, details are not described herein again.

The computer-readable storage medium includes permanent and non-permanent, removable and non removable media, which are tangible devices that can retain and store instructions for use by an instruction execution device. The computer-readable storage medium includes an electronic storage device, a magnetic storage device, an optical storage device, an electromagnetic storage device, a semiconductor storage device, and any suitable combination of the above. The computer-readable storage medium includes a phase-change random access memory (PRAM), a static random access memory (SRAM), a dynamic random access memory (DRAM), other types of random access memories (RAM), a read-only memory (ROM), a non-volatile RAM (NVRAM), an electrically erasable programmable RAM (EEPROM), a flash memory, or other memory technologies, a compact disk ROM (CD-ROM), a digital versatile disc (DVD) or other optical storages, a magnetic cassette tape storage, a magnetic tape disc storage or other magnetic storage devices, a memory stick, a mechanical encoding apparatus (such as a punched card or a convex structure in a groove recorded with instructions), or any other non-transmission media that can be used to store information accessible by a computing device. As defined in the embodiments of the present invention, the computer-readable storage medium does not include temporary signals, such as radio waves or other electromagnetic waves that propagate freely, electromagnetic waves that propagate through waveguides or other transmission media (such as optical pulses passing through optical fiber cables), or electrical signals transmitted through guide wires.

In the plurality of embodiments provided in this application, it should be understood that the disclosed apparatus, electronic device, and method may be implemented in other ways. For example, the described apparatus embodiment is merely an example. For example, the module or unit division is merely logical function division and may be other division in actual implementation. For example, a plurality of units or components may be combined or integrated into another system, or some features may be ignored or not performed. In addition, the mutual coupling or direct coupling or communicative connection shown or discussed may be indirect coupling or communicative connection through some interfaces, apparatuses, or units, or may be electrical, mechanical, or other forms of connection.

The units described as separate components may or may not be physically separate. The components displayed as the units may or may not be physical units. The components may be located in one position, or may be distributed on a plurality of network units. Some or all of the units may be selected based on actual requirements to resolve the problem to be resolved through the solutions in the embodiments of the present invention.

In addition, functional units in the embodiments of the present invention may be integrated into one processing unit, or each of the units may exist alone physically, or two or more units are integrated into one unit. The above integrated units may be implemented in the form of hardware or software functional units.

When the integrated units are implemented in the form of software functional units and sold or used as an independent product, the integrated units may be stored in a computer-readable storage medium. Based on such an understanding, the technical solutions in the embodiments of the present invention essentially, or the part contributing to the prior art, or some or all of the technical solutions may be implemented in a form of a software product. The computer software product is stored in a storage medium, and includes several instructions for instructing a computer device (including a personal computer, a server, a data center, or other network devices) to perform all or some of the steps of the methods described in the embodiments of the present invention. The storage medium includes various media that can store program code as listed above.

In the description of the embodiments of the present invention, those skilled in the art should know that the embodiments of the present invention may be implemented as a method, an apparatus, an electronic device, and a computer-readable storage medium. Therefore, the embodiments of the present invention may be specifically implemented in following forms: a hardware only form, a software only form (including firmware, resident software, microcode, and the like), or a form of a combination of software and hardware. In addition, in some embodiments, the embodiments of the present invention may be implemented in a form of computer program products in one or more computer-readable storage media. The computer-readable storage media include computer program code.

The computer-readable storage media may be any combination of one or more computer-readable storage media. The computer readable storage media may include electrical, magnetic, optical, electromagnetic, infrared, or semiconductor systems, apparatuses, or devices, or any combination thereof. More specific examples of the readable storage media include a portable computer disk, a hard disk, a random access memory (RAM), a read-only memory (ROM), an erasable programmable ROM (EPROM), a flash memory, an optical fiber, a compact disk ROM (CD-ROM), an optical storage device, a magnetic memory device, or any combination of the above. In the embodiments of the present invention, the computer readable storage media may be any tangible medium including or storing a program, and the program may be used by or in combination with an instruction execution system, apparatus, or device.

The computer program code included in the above computer-readable storage media may be transmitted by any suitable medium, including wireless media, wire media, optical cables, radio frequency (RF), or any suitable combination of the above.

The computer program code for performing the operations of the embodiments of the present invention may be written in assembly instructions, instruction set architecture (ISA) instructions, machine instructions, machine related instructions, microcode, firmware instructions, state setting data, integrated circuit configuration data, one or more programming languages, or a combination thereof. The programming languages include object-oriented programming languages such as Java, Smalltalk, and C++, and further include conventional procedural programming languages such as a C language or similar programming languages. The computer program code may be fully or partly executed on a computer of a user, or may be executed as an independent software package, or may be partly executed on the computer of the user and partly executed on a remote computer, or may be fully executed on the remote computer or a server. In case of the remote computer, the remote computer may be connected to the computer of the user through any network, including a local area network (LAN) or a wide area network (WAN), or may be connected to an external computer.

In the embodiments of the present invention, the provided method, apparatus, and electronic device are described through flowcharts and/or block diagrams.

It should be understood that each block in the flowcharts and/or block diagrams and a combination of the blocks in the flowcharts and/or block diagrams may be implemented through computer-readable program instructions. The computer-readable program instructions may be provided to a general purpose computer, a special purpose computer, or a processor of other programmable data processing apparatuses, to produce a machine. The computer-readable program instructions are executed by the computer or the other programmable data processing apparatuses to generate an apparatus that implements the functions/operations specified in the blocks in the flowcharts and/or block diagrams.

Alternatively, the computer-readable program instructions may be stored in a computer-readable storage medium so that the computer or the other programmable data processing apparatuses operate in a particular manner. In this way, the instructions stored in the computer-readable storage medium produce an instruction apparatus product that realizes the functions/operations specified in the blocks in the flowcharts and/or block diagrams.

Alternatively, the computer-readable program instructions may be loaded to the computer, the other programmable data processing apparatuses, or other devices, so that a series of operation and steps are performed on the computer, the other programmable data processing apparatuses, or the other devices to generate a computer-implemented process. In this way, the instructions executed on the computer or the other programmable data processing apparatuses can provide a process for implementing the functions/operations specified in the blocks in the flowcharts and/or the block diagrams.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A method for operation and maintenance of a battery, comprising:

performing a charging/discharging process on a to-be-analyzed battery cluster, and determining key battery parameters (KBP) of a plurality of cells in the battery cluster, wherein the KBPs comprise an internal resistance, capacity parameters, and a self-discharge parameter;

determining whether the battery cluster is abnormal depending on whether the KBPs of the cells in the battery cluster exceed a normal range; and performing operation and maintenance on the battery cluster in a case that the battery cluster is abnormal, wherein said performing the charging/discharging process on the to-be-analyzed battery cluster, and said determining the KBPs of the plurality of cells in the battery cluster comprises:

performing a full charging/discharging process on the to-be-analyzed battery cluster, and determining differential capacities versus voltage of the plurality of cells in the battery cluster at different times, wherein a constant current exists in at least part of a time period of the full charging/discharging process; and determining first times and first states of charge (SOC) when the differential capacities versus voltage of the cells reach a first peak and second times and second SOCs when the differential capacities versus voltage of the cells reach a second peak, and determining the capacity parameters of the cells according to the first times, the first SOCs, the second times, and the second SOCs, wherein the second SOCs are greater than the first SOCs.

2. The method according to claim 1, wherein said determining whether the battery cluster is abnormal comprises:

presetting a corresponding abnormality threshold for each of the KBPs; and determining that the cells in the battery cluster are abnormal in a case that the KBPs of the cells exceed the abnormality threshold.

3. The method according to claim 2, wherein at least one of the abnormality thresholds is a threshold determined according to a KBP in historical operation data or a safety parameter provided by a manufacturer; or the abnormality threshold $r_{th}$ is: $r_{th}=(r_1+r_0)/2+\sigma^2 \ln \lambda/(r_1-r_0)$, wherein $r_1$ is a value corresponding to a determination that the KBP is abnormal, $r_0$ and $\sigma$ respectively represent an average value and a mean square difference of a data stream transmitted when the KBPs are normal, and $\lambda$ is a preset coefficient related to a confidence level.

4. The method according to claim 1, wherein said determining whether the battery cluster is abnormal comprises:

determining whether the KBPs of the plurality of cells exceed a normal distribution range according to a distribution of the KBPs of the cells; and determining that the cells are abnormal in a case that the KBPs of the cells exceed the normal distribution range.

5. The method according to claim 1, wherein said performing operation and maintenance on the battery cluster comprises:

dynamically adjusting a charging/discharging control parameter of the battery cluster in a case that the battery cluster is in a sub-healthy state;

equalizing the battery cluster if a capacity allowed to be increased that is determined based on the capacity parameters is greater than a preset capacity in a case that the battery cluster is in the sub-healthy state; and enabling/disabling the battery cluster in a case that the battery cluster is in a faulty state.

6. The method according to claim 1, wherein the self-discharge parameter comprises a full charge time difference, and the full charge time difference of a cell k in the battery cluster is a difference between a full charge time of the cell k and a full charge time of a reference cell in the battery cluster.

7. The method according to claim 6, wherein said performing operation and maintenance on the battery cluster comprises:

charging the cell k alone to an ending voltage after charging of the battery cluster ends in a case that the full charge time difference of the cell k is abnormal and the internal resistance is normal; and discharging the cell k alone to an ending voltage after discharging of the battery cluster ends in a case that the internal resistance of the cell k is abnormal and the full charge time difference is normal.

8. The method according to claim 1, wherein the capacity parameters of a cell k in the battery cluster comprises a capacity $C_{k,chrend}$ by which the cell k is to be further charged when a charging ending moment of the battery cluster is reached and a capacity $C_{k,disend}$ by which the cell k is to be further discharged when a discharging ending moment of the battery cluster is reached.

9. The method according to claim 8, wherein said performing operation and maintenance on the battery cluster comprises:

determining, according to a capacity by which each of the cells is to be further charged at a charging ending moment of the battery cluster, the earliest fully charged cell j in the battery cluster and the earliest fully charged cell j' other than the cell j, wherein if the cell j is replaced, an effective charge capacity of the battery cluster is increased by $C_{j',chrend}$; and if the cell j is discharged alone to an ending voltage after discharging of the battery cluster ends, the effective charge capacity of the battery cluster is increased by min $[C_{j',chrend}, C_{j,disend}]$.

10. The method according to claim 1, wherein said performing operation and maintenance on the battery cluster comprises:

determining, according to a capacity by which each of the cells is to be further discharged at a discharging ending moment of the battery cluster, the earliest fully discharged cell i in the battery cluster and the earliest fully discharged cell i' other than the cell i, wherein if the cell i is replaced, an effective discharge capacity of the battery cluster is increased by $C_{i',disend}$; and if the cell i is charged alone to an ending voltage after charging of the battery cluster ends, the effective discharge capacity of the battery cluster is increased by min $[C_{i',disend}, C_{i,chrend}]$.

11. The method according to claim 1, wherein in a case that the full charging/discharging process comprises a full charging process, in the full charging process, the constant current exists in at least a time period from a charging beginning time to a largest one of the second times of the plurality of cells, and the full charging process begins when the battery cluster reaches a discharging ending voltage and ends when the battery cluster reaches a charging ending voltage; and in a case that the full charging/discharging process comprises a full discharging process, in the full discharging process, the constant current exists in at least a time period from a smallest one of the second times of the plurality of cells to a discharging ending time, and the full discharging process begins when the battery cluster reaches the charging ending voltage and ends when the battery cluster reaches the discharging ending voltage.

12. The method according to claim 11, wherein said determining the capacity parameters of the cells according to the first times, the first SOCs, the second times, and the second SOCs comprises:

determining, according to a first $SOC_{k,I\ peak}$ and a second $SOC_{k,II\ peak}$ of the cell k in the battery cluster, a difference $\Delta SOC_k$ between the SOCs of the cell k when reaching the first peak and the second peak, wherein $\Delta SOC_k = SOC_{k,II\ peak} - SOC_{k,I\ peak}$; and determining a difference $\Delta Q_k$ between capacities of the cell k when reaching the first peak and the second peak, and determining a maximum capacity $Q_{kmax}$ of the cell k, wherein $Q_{kmax} = 100\% \times \Delta Q_k / \Delta SOC_k$.

13. The method according to claim 12, wherein said determining the capacity parameters of the cells according to the first times, the first SOCs, the second times, and the second SOCs further comprises:

determining a charging ending $SOC_{k,end}$ of the cell k at a charging ending moment of the battery cluster according to a target time and a target SOC when the cell k reaches a target peak and the maximum capacity $Q_{kmax}$ of the cell k, wherein the target peak is the first peak or the second peak, and the target time is the corresponding first time or second time; and determining, based on the charging ending $SOC_{k,end}$ of the cell k, the capacity $C_{k,chrend}$ by which the cell k is to be further charged when the charging ending moment of the battery cluster is reached and the capacity $C_{k,disend}$ by which the cell k is to be further discharged when a discharging ending moment of the battery cluster is reached, wherein the capacity $C_{k,chrend}$ by which the cell is to be further charged at the charging ending moment and the capacity $C_{k,disend}$ by which the cell is to be further discharged at the discharging ending moment satisfy:

$$C_{k,chrend} = (1 - SOC_{k,end}) \times Q_{kmax};$$

$$C_{k,disend} = SOC_{k,end} \times Q_{kmax} - \int_{t_{k,begin}}^{t_{k,end}} I\ dt,$$

where $t_{k,begin}$ represents a beginning time of the full charging/discharging process of the cell k, $t_{k,end}$ represents an ending time of the full charging/discharging process of the cell k, and I represents a current value in the full charging/discharging process.

14. The method according to claim 13, wherein said determining the capacity parameters of the cells according to the first times, the first SOCs, the second times, and the second SOCs further comprises:

determining a charge capacity $C_{k,charge}$ of the cell k and a discharge capacity $C_{k,discharge}$ of the cell k, wherein the charge capacity $C_{k,charge}$ and the discharge capacity $C_{k,discharge}$ satisfy:

$$C_{k,charge} = \int_{t_{k,begin}}^{t_{k,end}} I\ dt + (1 - SOC_{k,end}) \times Q_{kmax};$$

$$C_{k,discharge} = SOC_{k,end} \times Q_{kmax}.$$

15. The method according to claim 13, wherein in a case that the full charging/discharging process comprises the full charging process, the charging ending $SOC_{k,end}$ of the cell k satisfies:

$$SOC_{k,end} = SOC_{k,T\ peak} + \int_{t_{k,T\ peak}}^{t_{k,chrend}} I\ dt / Q_{kmax};$$

in a case that the full charging/discharging process comprises the full discharging process, the charging ending $SOC_{k,end}$ of the cell k satisfies:

$$SOC_{k,end} = SOC_{k,T\ peak} + \int_{t_{k,disbegin}}^{t_{k,T\ peak}} I\ dt / Q_{kmax},$$

where $SOC_{k,T\ peak}$ represents an SOC of the target peak, $t_{k,T\ peak}$ represents the target time of the target peak, $t_{k,chrend}$ represents a charging ending time of the cell k, and $t_{k,disbegin}$ represents a discharging beginning time of the cell k.

16. An electronic device, comprising a bus, a transceiver, a memory, a processor, and a computer program stored in the memory and runnable on the processor, wherein the transceiver, the memory, and the processor are connected through the bus, and when the computer program is executed by the processor, the steps in the method for battery operation and maintenance according to claim 1 are implemented.

17. A non-transitory tangible computer-readable storage medium, storing a computer program therein, wherein when the computer program is executed by a processor, the steps in the method for battery operation and maintenance according to claim 1 are implemented.

\*　　\*　　\*　　\*　　\*